United States Patent
Yang et al.

(10) Patent No.: US 11,365,333 B2
(45) Date of Patent: Jun. 21, 2022

(54) OMNI-TRANSPARENT AND SUPERHYDROPHOBIC COATINGS ASSEMBLED FROM CHAIN-LIKE NANOPARTICLES

(71) Applicant: THE TRUSTEES OF THE UNIVERSITY OF PENNSYLVANIA, Philadelphia, PA (US)

(72) Inventors: Shu Yang, Blue Bell, PA (US); Gaoxiang Wu, Philadelphia, PA (US); Dengteng Ge, Songjiang (CN); Yubo Zhao, Guangzhou (CN)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 16/099,843

(22) PCT Filed: May 9, 2017

(86) PCT No.: PCT/US2017/031668
§ 371 (c)(1),
(2) Date: Nov. 8, 2018

(87) PCT Pub. No.: WO2017/196789
PCT Pub. Date: Nov. 16, 2017

(65) Prior Publication Data
US 2019/0106611 A1    Apr. 11, 2019

Related U.S. Application Data

(60) Provisional application No. 62/333,459, filed on May 9, 2016.

(51) Int. Cl.
*C09K 3/18* (2006.01)
*C03C 17/42* (2006.01)
(Continued)

(52) U.S. Cl.
CPC .............. *C09K 3/18* (2013.01); *C03C 17/007* (2013.01); *C03C 17/42* (2013.01); *C09D 1/00* (2013.01);
(Continued)

(58) Field of Classification Search
CPC ......... C09K 3/18; C03C 17/42; C03C 17/007; C03C 2217/42; C03C 2218/31;
(Continued)

(56) References Cited

U.S. PATENT DOCUMENTS 8,945,670 B2 *    2/2015    Domereq ............... C03C 17/001
                                                                   427/180
2006/0088852 A1    4/2006    Petersohn et al.
(Continued)

OTHER PUBLICATIONS

Bhushan, B.; Jung, Y. C.; Koch, K. Philosophical Transactions of the Royal Society A: Mathematical, Physical and Engineering Sciences 2009, 367, (1894), 1631-1672.
(Continued)

*Primary Examiner* — Nathan L Van Sell
(74) *Attorney, Agent, or Firm* — BakerHostetler LLP

(57) ABSTRACT

The present invention provides a layered coating adhered to a substrate surface which conforms to a surface topography defined by the anisotropic chain-like silica nanoparticles on the substrate. The layered coating comprises a layer of anisotropic chain-like silica nanoparticles. The anisotropic chain-like silica nanoparticles comprise linked arrays of silica net-negatively charged nanoparticles, each linked array having at least one linear dimension of about 100 nm to about 1200 nm and the anisotropic chain-like silica nanoparticles each have a diameter of about 20 nm to about 80 nm. The substrate surface comprises surface active moieties carrying a net positive charge and the chain-like anisotropic silica nanoparticles are held to the surface by electrostatic charge. Advantageously, the layered coatings
(Continued)

are transparent and superhydrophobic. Also provided are articles containing these layered coatings.

13 Claims, 20 Drawing Sheets

(51) Int. Cl.
C03C 17/00 (2006.01)
C09D 1/00 (2006.01)
C09D 5/00 (2006.01)
C23C 16/02 (2006.01)
C23C 16/458 (2006.01)
H01L 23/00 (2006.01)

(52) U.S. Cl.
CPC ............ *C09D 5/00* (2013.01); *C23C 16/0272* (2013.01); *C23C 16/4581* (2013.01); *H01L 23/564* (2013.01); *C03C 2217/42* (2013.01); *C03C 2217/76* (2013.01); *C03C 2218/31* (2013.01); *C03C 2218/322* (2013.01)

(58) Field of Classification Search
CPC .......... C03C 2217/76; C03C 2218/322; H01L 23/564; C09D 1/00; C09D 5/00; C23C 16/0272; C23C 16/4581
See application file for complete search history.

(56) References Cited

U.S. PATENT DOCUMENTS

| | | | |
|---|---|---|---|
| 2009/0124016 A1* | 5/2009 | Santore | G01N 33/54306 436/86 |
| 2010/0035365 A1 | 2/2010 | Wiesner et al. | |
| 2013/0108832 A1* | 5/2013 | Domereq | C03C 17/001 428/141 |
| 2014/0084519 A1 | 3/2014 | Porro et al. | |
| 2015/0343387 A1 | 12/2015 | Kim et al. | |

OTHER PUBLICATIONS

Bravo, J.; Zhai, L.; Wu, Z.; Cohen, R. E.; Rubner, M. F. Langmuir 2007, 23, (13), 7293-7298.
Campos, R.; Guenthner, A. J.; Meuler, A. J.; Tuteja, A.; Cohen, R. E.; McKinley, G. H.; Haddad, T. S.; Mabry, J. M. Langmuir 2012, 28, (25), 9834-9841.
Cassie and Baxter, Transactions of the Faraday Society, 40(0):546-551, 1944.
Deng, Applied Physics Letters, 94(13): 133109, 2009.
Johnson et al., "Adsorption of Charged Latex Particles on Mica Studied by Atomic Force Microscopy", Journal of Colloid And Interface Science, vol. 179, (1996), pp. 587-599.
Karunakaran, R. G.; Lu, C.-H.; Zhang, Z.; Yang, S. Langmuir 2011, 27, (8), 4594-4602.
Lafuma, Superhydrophobic states, Nat. Mater., 2003, 2(7):457-460.
Ling, X. Y.; Phang, I. Y.; Vancso, G. J.; Huskens, J.; Reinhoudt, D. N. Langmuir 2009, 25, (5), 3260-3263.
McCarthy, Applied Physics Letters, 100(26):263701.
Nosonovsky et al., "Hierarchical roughness optimization for biomimetic superhydrophobic surfaces", Ultramicroscopy, vol. 107, (2007), pp. 969-979.
Ogihara, H.; Xie, J.; Okagaki, J.; Saji, T. Langmuir 2012, 28, 4605.
Park, K.-C.; Choi, H. J.; Chang, C.-H.; Cohen, R. E.; McKinley, G. H.; Barbastathis, G. ACS Nano 2012, 6, (5), 3789-3799.
Prevo, B. G.; Hwang, Y.; Velev, O. D. Chemistry of Materials 2005, 17, (14), 3642-3651.
Quéré, D.; Azzopardi, M.-J.; Delattre, L. Langmuir 1998, 14, (8), 2213-2216.
Rahmawan, Y.; Xu, L.; Yang, S. Journal of Materials Chemistry A 2013, 1, (9), 2955-2969.
Raut, Energy & Environmental Science, 4(10):3779-3804 (2011).
Reyssat, Europhys. Lett., 74(2):306-312, 2006.
Rykaczewski, Microdroplet Growth Mechanism during Water Condensation on Superhydrophobic Surfaces. Langmuir, 2012, 28(20):7720-7729.
Spilhaus, Shorter Contributions Raindrop size, shape, and falling speed, Journal of Meterology, 1948, 5(3): 108-110.
Van Boxel, Numerical model for the fall speed of rain drops in a rain fall simulator, I.C.E. Special Report, 1998, 77-85.
Wang et al. Preparation of Anisotropic Silica Nanoparticles via Controlled Assembly of Presynthesized Spherical Seeds, Langmuir 2010, 26(23), 18491-18498, abstract; FIGS. 1, 7; p. 18492, col. 2, sections 2.2, 2.3; p. 19493, col. 1; p. 18496, col. 1; p. 18497.
Xu, L.; Karunakaran, R. G.; Guo, J.; Yang, S. ACS Applied Materials & Interfaces 2012, 4, (2), 1118-1125.

* cited by examiner

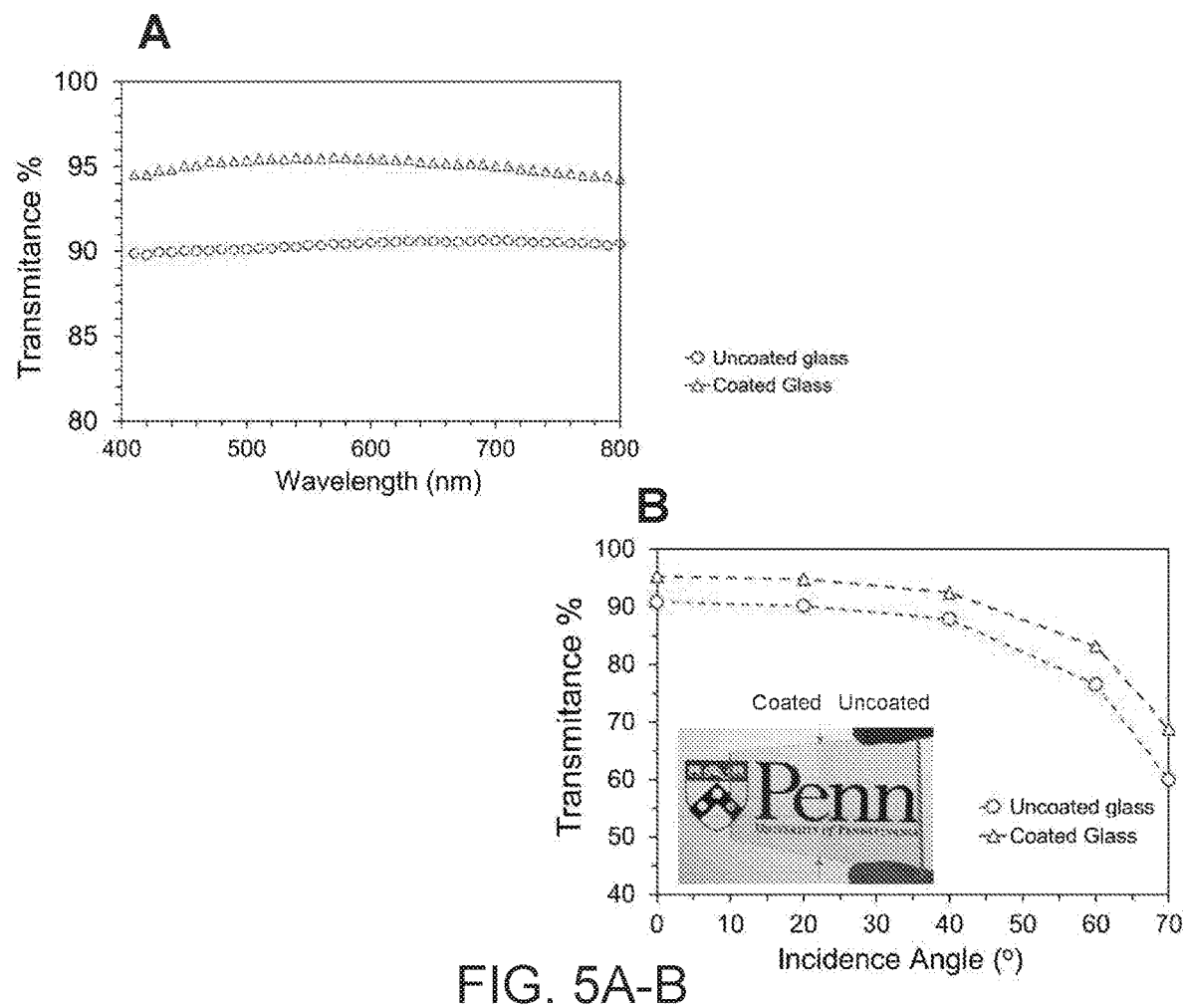
FIG. 5A-B

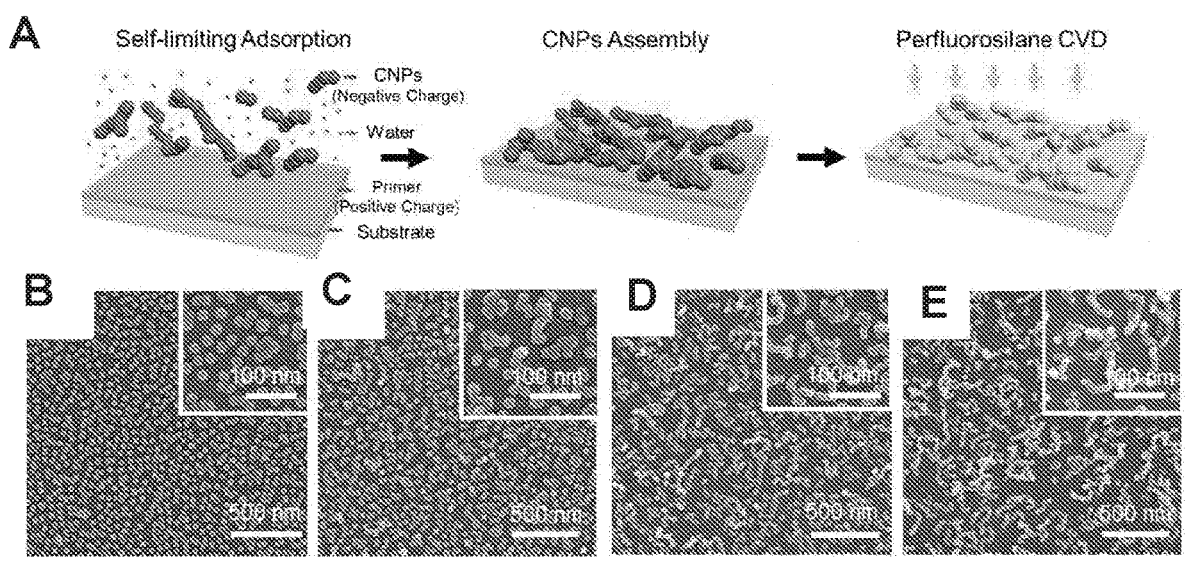
FIG. 6A-E

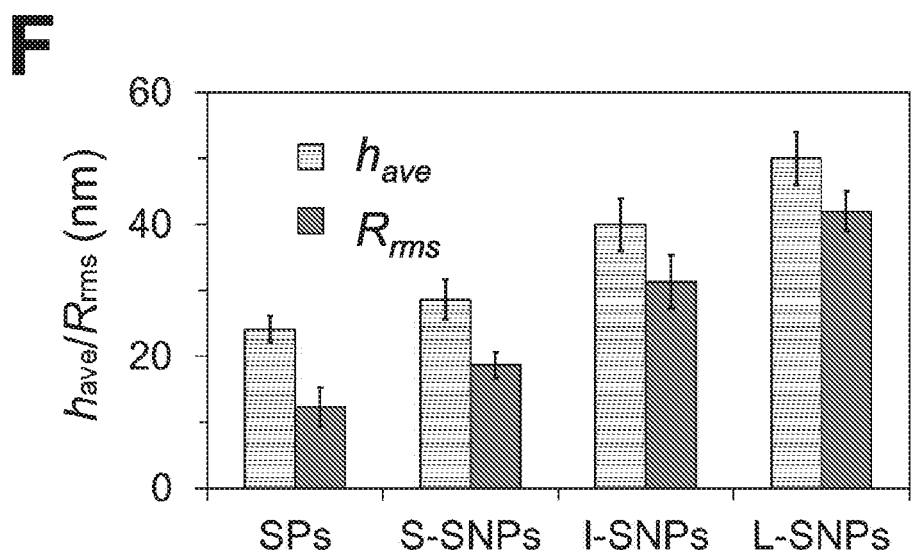
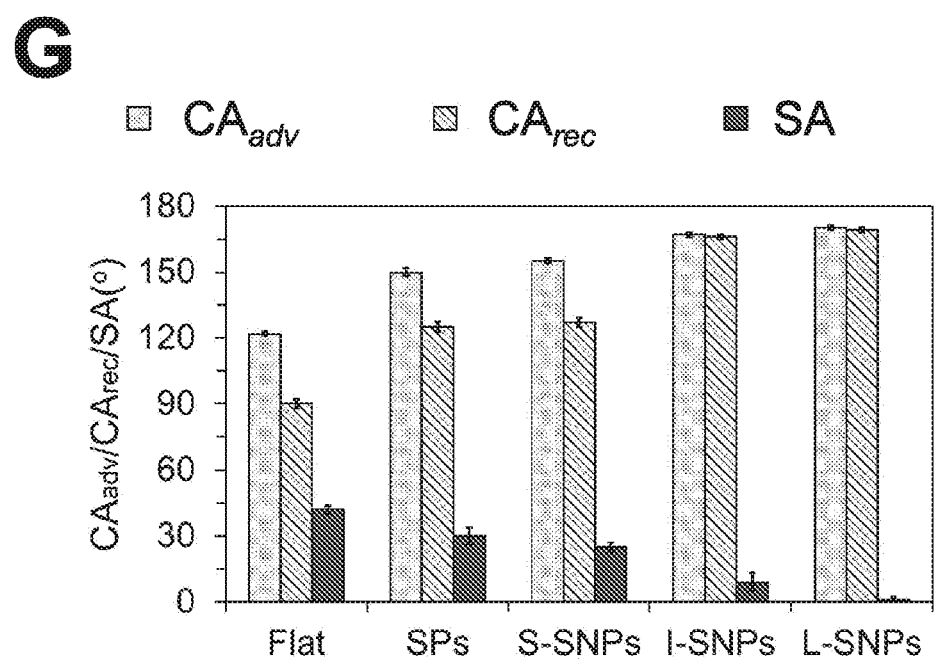
FIG. 6F-G

| | Fluoropolymer pillars D ~ 2 um, P = 4 um, AR ~ 4 | Neverwet ® | Ultra-thin NP Coating |
|---|---|---|---|
| Dry | | | |
| Wetted by Ethanol | | | |
| After Water Washing | | | |
| Water Drop on Washed Surface | | | |

FIG. 11

OMNI-TRANSPARENT AND SUPERHYDROPHOBIC COATINGS ASSEMBLED FROM CHAIN-LIKE NANOPARTICLES

CROSS-REFERENCE TO RELATED APPLICATIONS

This application is the National Stage Application of International Patent Application No. PCT/US2017/031668 filed May 9, 2017, which claims priority to U.S. Provisional Patent Application No. 62/333,459, "Omni-Transparent and Superhydrophobic Coatings Assembled from Chain-Like Nanoparticles" (filed May 9, 2016), the entireties of which applications are incorporated by reference herein for any and all purposes.

TECHNICAL FIELD

This invention relates to layered coatings containing silica anisotropic nanoparticle chains and methods for making and using same.

BACKGROUND

Inspired by biological surfaces such as lotus leaves and water strider legs, which exhibit water contact angles of 150° or larger, there have been great interests to create synthetic superhydrophobic surfaces. Such water-repellent surfaces offer potential applications in anti-biofouling, anti-corrosion, anti-condensation (e.g., anti-icing, anti-fogging), and selective oil/water, gas/liquid separation, and microfluidics. Further such surfaces also benefit in having reduced maintenance and cleaning. For solar panels, windows, and outdoor displays, it is also important that the coating should be highly transparent or even enhance optical transmittance of the substrates while maintaining superhydrophobic properties under various outdoor conditions.

Achieving both superhydrophobicity and high optical quality has been challenging because the surface roughness required to achieve superhydrophobicity may lead to severe light scattering, which renders surfaces opaque or translucent. Top-down techniques such as photolithography and nanoimprint lithography have been used to create nanostructures with both good transparency and superhydrophobicity. However, these techniques rely on expensive instruments and the fabricated structures are often limited to a small area.

To produce large-area and scalable coatings, nanoparticle assemblies are often used since they are inexpensive and versatile to apply to a wide range of substrates, and compatible with many existing coating techniques. Convective assembly methods, e.g. evaporation induced self-assembly, are commonly used for the creation of nanoparticle coatings. However, these approaches do not allow for manipulation of the deposit structures since they strongly favor close packing with reduced surface roughness. Transparent superhydrophobic surfaces from assemblies of spherical nanoparticles have been prepared via techniques including layer-by-layer deposition, hierarchical assembly, spin-coating, and spray coating. However, to achieve superhydrophobicity, large roughness or high aspect ratios are generally required, thereby necessitating the deposition of multilayered nanoparticles. Further, once wetted, e.g., under high impact pressure, the grooves between nanoparticles are filled with water, and the high aspect ratio structures make it difficult for water to dewet from such surfaces and recover the superhydrophobicity. Multilayered nanoparticles have the potential to deteriorate the optical transparency due to the more pronounced scattering effects even the individual nanoparticle size is well-below the subwavelength. In contrast, while thin-layer or monolayer nanoparticle coatings can achieve better transparency, the surface roughness is often not sufficient to achieve superhydrophobicity.

There remains a need in the art for a coating system that includes a thin-layer coating of nanoparticles and provides enhanced surface roughness for superhydrophobicity.

SUMMARY

In one aspect, a layered coating adhered to a substrate surface is provided, wherein the layered coating comprises a layer of chain-like anisotropic silica nanoparticles (CNPs). The anisotropic chain-like silica nanoparticles comprise linked arrays of silica net-negatively charged nanoparticles, each linked array having at least one linear dimension of about 100 nm to about 1200 nm. The anisotropic chain-like silica nanoparticles also each have a diameter of about 20 nm to about 80 nm. The substrate surface comprises surface active moieties carrying a net positive charge, the chain-like anisotropic silica nanoparticles are held to the surface by electrostatic charge, and the layered coating conforms to a surface topography defined by the chain-like silica nanoparticles on the substrate. In one embodiment, the layered coating transmits greater than about 90% of incident light having a wavelength of about 400 nm to about 800 nm. In another embodiment, the layered coating substantially resists condensation. In a further embodiment, the layered coating substantially resists fogging.

In another aspect, a method of preparing a superhydrophobic and optically transparent layered coating is provided. The method includes (a) functionalizing a substrate with surface active moieties carrying a net positive charge, (b) depositing a layer of chain-like silica nanoparticles on the substrate, and (c) washing the product of step (b) with solvent. In one embodiment, step (c) is performed using dip coating, drop casting or slot coating. The anisotropic chain-like silica nanoparticles comprise linked arrays of silica net-negatively charged nanoparticles, each linked array having at least one linear dimension of about 100 nm to about 1200 nm. The anisotropic chain-like silica nanoparticles also each have a diameter of about 20 nm to about 80 nm, the chain-like anisotropic silica nanoparticles are held to the surface by electrostatic charge, and the layered coating conforms to a surface topography defined by the chain-like silica nanoparticles on the substrate.

In a further aspect, the chain-like anisotropic silica nanoparticles are prepared by (i) reacting a first portion of an alkoxy substituted silicate with an amino acid including arginine or glutamic acid in water to provide spherical silica seeds and (ii) reacting about 1.5 to about 2.5 wt % of the spherical silica seeds with about 0.05 to about 0.5 wt % of the amino acid and about 0.5 to about 2.5 wt % of a second portion of the alkoxy substituted silicate in about 23 to about 83 wt % of aqueous ethanol.

In still another aspect, a superhydrophobic and omni-transparent article is provided and is prepared according to the methods described herein.

In yet a further aspect, an article is provided and comprises a layered coating described herein.

Other aspects and embodiments of the invention will be readily apparent from the following detailed description of the invention.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific compositions, methods, devices, and systems disclosed. In addition, the drawings are not necessarily drawn to scale.

FIG. 1A is a top view and FIG. 1B is a side view of the nanoparticles.

FIGS. 5A-5B are transmission spectra of the coated (upper line, triangle) and uncoated glass (o) slides. FIG. 5A illustrates the transmittance from varying wavelengths (nm), i.e., from visible to NIR. FIG. 5B illustrates the transmittance (%) from different incidence angles)(° at a fixed wavelength of 500 nm. The inset in FIG. 5B is a photograph of a glass side with the left side coated with anisotropic chain-like silica nanoparticles and placed at an angle of 60° relative to a computer screen.

FIG. 6A is the schematic of the nanoparticle deposition by charge-induced adsorption. FIGS. 6B-E are top-view SEM images of coating formed by NPs with different morphologies: spherical nanoparticles (SPs, FIG. 6B), short-chain nanoparticles with a length of 40-80 nm (S-CNPs—FIG. 6C), I-CNPs (intermediate-chain nanoparticles with a length of 80-200 nm—FIG. 6D), and L-CNP (long-chain nanoparticles with a length of 300-600 nm—FIG. 6E) coated at the condition (i.e. pH 6, and 0.05 wt %) on APTMS treated substrate. FIG. 6F is a bar graph showing the average coating thickness (i.e. the average height obtained from atomic force microscopy (AFM) scan) and root-mean-square (RMS) roughness of the coating formed from nanoparticles with different lengths. FIG. 6G is a bar graph showing the advancing contact angle ($CA_{adv}$), receding contact angle ($CA_{rec}$), sliding angle (SA, the onset of a substrate tilt angle when the water droplet, 10 µL, starts to slide) on the coatings formed from nanoparticles of different chain-length after perfluorosilane treatment.

FIGS. 7A/C are AFM images and line-profiles of the surface saturated with string-like particles and spherical particles, respectively. The bar graphs of FIGS. 7B/D summarize the data from the line-profiles.

FIG. 8A is the transmission spectrum of the coated (-) vs. uncoated (---) glass slides from visible to NIR wavelength.

FIG. 10B (right) are schematic illustrations of water coalescence as seen in the left images.

FIG. 11 are photographs of a fluoropolymer micropillar substrate (diameter=about 2 µm, pitch=4 µm, aspect ratio=about 4) made from Fluorolink® PFPE (Solvay) using soft lithography technique, a Neverwet® spray coated substrate, and a substrate coated with a nanoparticle composition described herein after drying. All the substrates are pre-wetted with ethanol, followed by rinse with water. A new a water droplet is deposited on the washed surface.

DETAILED DESCRIPTION

Figure 1:
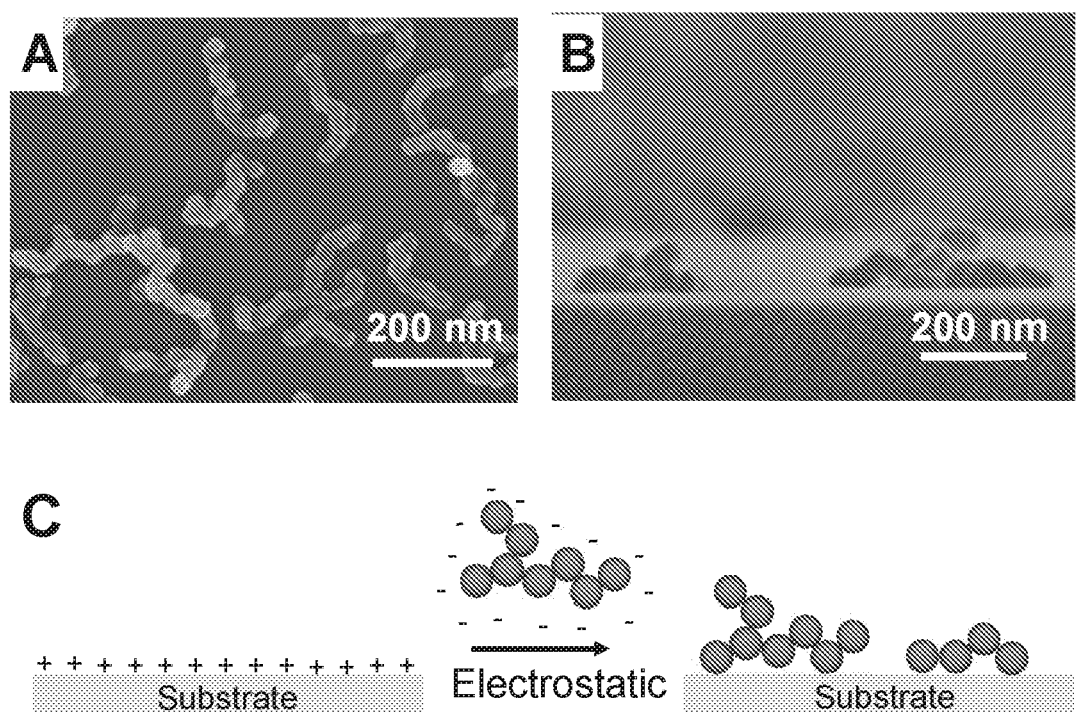
FIGS. 1A and 1B are scanning electron microscope (SEM) images of anisotropic chain-like silica nanoparticles prepared as described herein.
FIG. 1C is a schematic illustration of the coating of negatively charged anisotropic chain-like silica nanoparticles on a positively charged substrate.

As described herein, an anisotropic chain-like silica nanoparticle layered coating is provided and has many advantages over other coatings in the art, including superhydrophobicity together with omni-transparency. Specifically, the layered coatings have a topography which is sufficiently rough to support an independent water molecule, but not so rough as to contain deep grooves where water may become trapped. Accordingly, the "pillars" formed in the layered coating are shorter and contain more shallow grooves. In doing so, water that does fall into the shallow grooves can easily be removed or wicked out using another drop of water. This unexpected and surprising attribute lead to layered coatings having superhydrophobicity combined with omni-transparency. This new form of nanoparticles are chained together and highly wiggly, much like placing "nano-caltrops" onto the substrate with part of the chain pointing towards the interface, thus minimizing the contact between liquid and the nanotexture. By controlling the destabilizing effects of the seed particles, CNPs of different length were synthesized. Although the layered coatings described herein do not contain high "pillars" in the coatings, they are sufficiently rough enough as noted above. In one embodiment, the roughness of the layered coating is about 20 to about 200 nm. The roughness of the coating may be determined using skill in the art and atomic force microscope. As known in the art, "roughness" is calculated as root-mean-square (RMS) roughness. By way of example, in the nanoparticle layered coating described herein, the RMS roughness is about 40 to about 60 nm.

The anisotropic chain-like silica nanoparticle layered coating applied to the substrate is ultrathin, but still maintains its roughness over the substrate. In one embodiment, the layered coating has a thickness of about 100 nm or less. In another embodiment, the layered coating has a thickness of about 50 nm. Accordingly, the layered coatings are capable of forming monolayers.

Since the layered coatings described herein are superhydrophobic, they are capable of resisting condensation, fogging, or a combination thereof. By doing so, less water settles on a substrate, thereby leading to reduced deterioration of the substrate, longer lifetime of the substrate, among others.

This superhydrophobicity of the layered coatings also prevents the accumulation of dust, sand, pollen, dirt, among others on are also capable of optical devices, thereby blocking the light when the amount is minimal. Sand, pollen, dirt, or dust can, however, accumulate quickly or over time on optical devices and form a hardened layer which is difficult to remove. In fact, removing these hardened layers often is not easy. In some instances it is necessary to use a chemical (soap, base, acid) and/or a person must utilize extraneous measures to attend to windows, solar panels, or the like if the same are physically inaccessible and require the use of ladders or the like, both of which may be costly. However, the superhydrophobic layered coatings of the present invention prevent the accumulation of dust, dirt, pollen, and sand, among others, thereby reducing the need to utilize chemical cleaners and/or attend to inaccessible windows or solar panels. However, even when dust, dirt, pollen, sand accumulates on substrates coated with the superhydrophobic layered coatings discussed herein, rain or water will easily remove them, minimizing cleaning. Further, the superhydrophobic layered coatings described herein are cost-effective (not requiring regular cleaning), have simplified maintenance, and increase the lifetime of substrate being coated.

It is hypothesized that all of the advantageous properties discussed herein may be a result of electrostatic interactions between the anisotropic chain-like silica nanoparticles and the substrate, thereby leading to a superhydrophobic and transparent film. As used herein, "superhydrophobic" refers to surfaces that substantially repel water. Superhydrophobic surfaces include surfaces having a water contact angle (WCA) of 150° or greater with very small contact angle hysteresis (CAH) (typically less 10° from an enrolling 10-4 droplet). In some embodiments, the WCA is about 150 to about 160°. In further embodiments, the WCA is about 170° or larger. As used herein, a CAH refers to the difference between the advancing contact angle and receding contact angle. In one embodiment, the CAH is less than about 10°. In another embodiment, the CAH is less than about 5°. In a further embodiment, the CAH is less than about 1°.

The inventors found that the WCA underwent significant increase when the chain length was increased, while the CAH decreased significantly. To further quantify the interaction between water and the coating surfaces, the contact angle measurement was converted into two adhesion factors, that is normal and shear adhesion factors, which are dimensionless parameters proportional to the forces required to vertically detach the water droplet and shear the water droplet on the coating surface, respectively. Compared to the spherical particle (SP) coating, the normal and shear adhesion factors of the long CNP (L-CNP) coatings decreased by about 10 times and up to about 50 times, respectively. This significantly decreased liquid adhesion can be attributed to the large asperities formed by the highly wiggly nature of the CNPs as confirmed by atomic force microscopy (AFM) characterization of the coating surface morphology.

The present invention may be understood more readily by reference to the following description taken in connection with the accompanying Figures and Examples, all of which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, unless otherwise stated, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to the features and methods of making and using the layered coatings and films described herein.

In the present disclosure the singular forms "a", "an" and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When a value is expressed as an approximation by use of the descriptor "about" or "substantially" it will be understood that the particular value forms another embodiment. In general, use of the term "about" or "substantially" indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about" or "substantially". In other cases, the gradations used in a series of values may be used to determine the intended range available to the term "about" or "substantially" for each value. Where present, all ranges are inclusive and combinable. That is, references to values stated in ranges include every value within that range.

When a list is presented, unless stated otherwise, it is to be understood that each individual element of that list and every combination of that list is to be interpreted as a separate embodiment. For example, a list of embodiments presented as "A, B, or C" is to be interpreted as including the embodiments, "A," "B," "C," "A or B," "A or C," "B or C," or "A, B, or C."

It is to be appreciated that certain features of the invention which are, for clarity, described herein in the context of separate embodiments, may also be provided in combination in a single embodiment. That is, unless obviously incompatible or excluded, each individual embodiment is deemed to be combinable with any other embodiment(s) and such a combination is considered to be another embodiment. Conversely, various features of the invention that are, for brevity, described in the context of a single embodiment, may also be provided separately or in any sub-combination. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Finally, while an embodiment may be described as part of a series of steps or part of a more general structure, each said step may also be considered an independent embodiment in itself.

I. THE COATING COMPOSITION

The present invention provides a layered coating adhered to a substrate surface. The coated substrates described herein have substantially enhanced transparency at a broad range of incidence angles (referred as omni-transparent) compared to the uncoated substrates. The layered coatings described herein advantageously transmit greater than about 90% of incident light having a wavelength of about 400 nm to about 800 nm. In one embodiment, the layered coatings transmit greater than about 91, 92, 93, 94, 95, 96, 97, 98, or 99% of incident light.

The term "light" as used herein refers to infrared (including near-infrared), visible, ultraviolet light, or any combinations thereof. Visible light refers to that portion of the electromagnetic spectrum that is visible to or can be detected by the human eye, typically wavelengths from about 390 to about 700 nm. Infrared light is that light having wavelengths higher than the high end of this range, i.e., about 700 nm to about 1 mm, and ultraviolet refers to light having wavelengths at wavelengths lower than the low end of this range, i.e., about 10 to about 400 nm.

The coating comprises a layer of anisotropic chain-like silica nanoparticles. As used herein, "anisotropic chain-like silica nanoparticles" refer to a single unit of a linear or branched array of contiguous and linked nanoparticles, typically, but not necessarily, each "chain" having a diameter of about 20 to about 80 nm and at least one linear dimension of about 100 to about 1200 nm, preferably length above 400 nm, such as are shown the Figures. It is the anisotropic china-like silica nanoparticles that, when applied as a coating, define a surface topography.

The term "nanoparticle" refers to a particle having at least one dimension in the nanoscale dimension, i.e., a mean diameter, of about 10 nm to about 100 nm. The terms "mean diameter" or "mean cross-sectional dimension" refers to the arithmetic average of the lengths of the major and minor axes of the particles. However, certain embodiments contemplate a narrower particle size range. That is, in certain embodiments, at least some of the plurality of nanoparticles has a mean diameter of about 20 nm to about 60 nm. In other embodiments, substantially all of the nanoparticles in the film have a mean cross-sectional dimension within this range. In separate embodiments, the film comprises a plurality of particles having a mean diameter of about 20 to about 40 nm.

The nanoparticles making up the anisotropic chain-like silica nanoparticles are substantially spherical. To the extent that a given particle or population of particles deviates from a purely spherical shape, such that each particle can be described as having a major and minor axis, the present application includes embodiments wherein the ratio of the lengths of the major and minor axis of each particle can be about 2, less than 2, less than 1.5, less than 1.3, less than 1.2 or less, less than 1.1, or less than 1.05 or less than 1.02, for example, to 1. The term "substantially spherical" refers to a shape wherein the ratio of major/minor axis less than 1.1. Similarly, where the particles are other than purely spherical, the term "mean diameter" or "mean cross-sectional dimension" refers to the arithmetic average of the lengths of the major and minor axes of the particles.

The anisotropic chain-like silica nanoparticles may be prepared by reacting a first portion of an alkoxy substituted silicate with an amino acid including arginine or glutamic acid in water to provide spherical silica seeds. In one embodiment, the alkoxy substituted silicate is tetramethoxysilane, methyltriethoxysilane, methyltrimethoxysilane, tetraethylorthosilicate, or any combinations thereof. In another embodiment, the alkoxy substituted silicate is tetraethylorthosilicate. In a further embodiment, the reaction is performed using about 0.1 to about 0.15 wt % of the first portion of the alkoxy substituted silicate. In yet another embodiment, the reaction is performed using about 9 to about 12 wt % of the amino acid.

The spherical silica seeds are then reacted with a second portion of the amino acid and a second portion of the alkoxy substituted silicate in aqueous ethanol. In one embodiment, the reaction is performed using about 1.5 to about 2.5 wt % of the spherical silica seeds. In a further embodiment, the reaction is performed using about 2 wt % of the spherical silica seeds. In another embodiment, the reaction is performed using about 8 to about 12 wt % of a second portion of the alkoxy substituted silicate. In yet a further embodiment, the reaction is performed using about 0.5 to about 2.5 wt % of a second portion of the alkoxy substituted silicate. In still another embodiment, the reaction is performed using about 0.05 to about 0.5 wt % of the amino acid. In a further embodiment, the reaction is performed using about 0.3 to about 0.5 wt % of the amino acid. In another embodiment, the reaction is performed using about 74 to about 79 wt % of aqueous ethanol. In still a further embodiment, the reaction is performed using about 74 wt % of aqueous ethanol. In yet another embodiment, the anisotropic chain-like silica nanoparticles are prepared as described in Wang, Langmuir, 26(23):18491-18498, 2010.

In preparation for their application to the substrate as discussed below, surface hydroxyl groups may be introduced onto the anisotropic chain-like silica nanoparticles using skill in the art. In one embodiment, the hydroxyl groups are introduced using oxidation such as include oxygen plasma, ozonolysis, Piranha solution ($H_2SO_4:H_2O_2=3:1$ v/v), or chemical oxidizing agents (e.g., $H_2O_2$, halogens ($F_2$, $Cl_2$), $HNO_3$, $H_2SO_4$, $H_2S_2O_8$, $H_2SO_5$, $ClO_2^-$, $ClO_3^-$, $ClO_4^-$, $ClO^-$, $CrO_4^{2-}$, $Cr_2O_7^{2-}$, pyridinium chlorochromate, $MnO_4^-$, $NaBO_3$, $N_2O$, $Ag_2O$, $OsO_4$, $NO_3^-$, Tollens' reagent, 2,2-dipyridyldisulfide, or combinations thereof), among others. In another embodiment, hydroxyl groups are introduced onto the anisotropic chain-like silica nanoparticles using oxygen plasma.

The hydroxyl groups may then be functionalized with a surface active moiety carrying a net negative charge. In one embodiment, the surface active moiety is a silane having a negative charge, i.e., the hydroxyl group is silanized. In another embodiment, the silanizing is performed using a fluorinated silane, fluoropolymer, short chain perfluorinated oligomer, or any combination thereof. In a further embodiment, the silanizing is performed using 3-triethoxysilyl-propyl succinic anhydride, 3-trimethoxysilyl-propyl succinic anhydride, triethoxylsilyl-propyl succinic anhydride, trimethoxysilyl-propyl succinic anhydride, or any combinations thereof. The hydroxyl groups may alternatively be functionalized with a surface active moiety carrying a net positive charge, i.e., the hydroxyl group is silanized. In one embodiment, the surface active moiety is a silane having a positive charge.

The anisotropic chain-like silica nanoparticles are "worm-like" and, as noted above, are formed by contiguous and linked spherical nanoparticles. In doing so, each array or chain has a broad distribution of chain-length. In one embodiment, each array or chain has an overall length of about 100 to about 1200 nm. Accordingly, the anisotropic chain-like silica nanoparticles contain surface active moieties carrying a net negative charge or net positive charge. In one embodiment, the surface active moieties carrying a net negative charge are acid or hydroxyl moieties, among other negatively charged groups. In another embodiment, the surface active moieties carrying a net positive charge are amino moieties.

II. THE LAYERED COATINGS

The layered coatings described herein are prepared by depositing the anisotropic chain-like silica nanoparticles described above onto a substrate.

Suitable substrates include silicon wafers, glass, polymer substrates, such as polystyrene, poly(methylmethacrylate), polyester, poly(dimethylsiloxane), plastic, fabric, polycarbonate, paper (cellulose), metals, among others. Virtually any material may serve as a substrate provided that contains or is modified to contain surface active moieties carrying a net positive charge, and users of ordinary skill in the art will encounter little difficulty in identifying suitable substrate materials.

The substrates may be of any size that permits application of the anisotropic chain-like silica nanoparticles. The substrates may be small or large, depending on the article to be fabricated. Despite the difficulties in the art with layered coating larger substrates using other methods and substrates, larger substrates may be coated due to simplicity of the coating method discussed herein.

The method includes functionalizing a substrate with surface active moieties carrying a net positive charge. In doing so, a substrate surface layer containing these surface active moieties carrying a net positive charge is formed on the substrate. Alternatively, the substrate may be functionalized with surface active moieties carrying a net negative charge. In doing so, a substrate surface layer containing these surface active moieties carrying a net positive charge is formed on the substrate.

The thickness of the layer is dependent upon the reagents utilized and conditions. In one embodiment, the thickness of the substrate surface layer is about 0.1 to about 3 nm. In another embodiment, the thickness of the substrate surface layer is about 1 to about 1.5.

The surface active moieties carrying a net positive charge are amino groups. In another embodiment, the surface active moieties carrying a net positive charge are primary or secondary amino groups. The substrate may be functionalized using an alkoxylated silane or poly electrolytic polymer. In one embodiment, the polyelectrolytic polymer is poly(diallydimethylammonium chloride) or poly allylamine hydrochloride. In another embodiment, the alkoxylated silane is aminopropyltrimethoxysilane, aminopropyltrimethoxysilane, 3-glycidopropyltriethoxysilane, 3-glycidopropyltrimethoxysilane, aminobutyldimethylmethoxysilane, N-(2-aminoethyl)-3-aminopropyltrimethoxysilane, and 3-trimethoxysilylpropyl)diethylenetriamine, or any combination thereof. In a further embodiment, the alkoxylated silane is 3-aminopropyltrimethoxysilane.

The surface active moieties carrying a net negative charge contain $CO_2^-$ groups. In one embodiment, the surface active moieties carrying a net negative charge include 3-triethoxysilyl-propyl succinic anhydride, 3-trimethoxysilyl-propyl succinic anhydride, triethoxylsilyl-propyl succinic anhydride, trimethoxysilyl-propyl succinic anhydride, or any combinations thereof.

The surface active moieties may be introduced onto the substrate using chemical vapor deposition or in a solvent. In one embodiment, the solvent is a water-compatible solvent. In another embodiment, the solvent is acetone, toluene, water, or any combination thereof.

As an optional step, passivation of the surface may be performed to increase the adhesion of the nanoparticles to the substrate. In one embodiment, the surface is oxidized. Such suitable methods of oxidation include those describe above. In another embodiment, the surface is oxidized and then treated with a reagent to provide a high water contact angle. In a further embodiment, the reagent which provides the high water contact angle is a silane. Suitable silanes include perfluorosilane, (heptadecafluoro-1,1,2,2-tetrahydrodecyl)trichlorosilane, (heptadecafluoro-1,1,2,2-tetrahydrodrodecyl)dimethylchlorosilane, tridecafluoro-1,1,2,2-tetrahydroctyldimethylchlorosilane, 2-(di-n-octylmethylsilyl) ethyldimethylchlorosilane, nonafluorohexyldimethylchlorosilane, (3,3,3-trifluoropropyl)dimethylchlorosilane, n-octadecyldimethylchlorosilane, dodecyldimethylchlorosilane, among others or any combination thereof. In a further embodiment, the silanizing is performed using perfluorosilane.

After functionalizing the substrate, a layer of anisotropic chain-like silica nanoparticles as described above are deposited onto the substrate. As discussed above, the inventors hypothesized that the anisotropic chain-like silica nanoparticles bind to the substrate through electrostatic interactions. In one embodiment, the anisotropic chain-like silica nanoparticles comprise surface active moieties carrying a net negative charge, thereby resulting in an overall net-negative charge of the linked array of nanoparticles. In another embodiment, the substrate surface comprises surface active moieties carrying a net positive charge. Accordingly, the electrostatic interaction is a result of the interaction between the surface active moieties carrying a net positive charge and the moieties carrying a negative charge. Alternatively, the anisotropic chain-like silica nanoparticles comprise surface active moieties carrying a net positive charge and the substrate surface comprises surface active moieties carrying a net negative charge. Accordingly, the electrostatic interaction is a result of the interaction between the surface active moieties carrying a net negative charge and the moieties carrying a positive charge.

The concentration of anisotropic chain-like silica nanoparticles is about 0.05 to about 1 wt %. In one embodiment, the concentration of anisotropic chain-like silica nanoparticles is about 0.1 to about 0.7 wt %. In a further embodiment, the concentration of anisotropic chain-like silica nanoparticles is about 0.5 wt %.

The nanoparticles may be deposited on the substrate via a variety of techniques, including dip-coating, drop-casting, or slot-coating. The substrate is suitably contacted with the nanoparticle solution for time sufficient that the nanoparticles adhere onto the substrate with sufficient stability. In one embodiment, the substrate is contacted with the nanoparticle solution of about 1 to about 5 minutes.

One of skill in the art would readily be able to monitor the coating and utilize further laboratory techniques to complete the coating. Specifically, one or more steps noted herein may be performed at elevated temperatures, reduced pressures, varying humidities (using, e.g., a desiccator), drying at lower or higher temperatures in the absence or presence of stirring, centrifugation, sonication, and pH, among others. In one embodiment, the pH of the coating process is maintained. In one embodiment, the pH is maintained at about 5 to about 8. In a further embodiment, the pH is about 5.5 to about 6.5. In another embodiment, the pH is about 6.

After the substrate has been contacted with the anisotropic chain-like silica nanoparticles, the substrate is isolated and any unbound or loosely bound particles removed. In one embodiment, the unbound or loosely bound particles are removed by washing. In another embodiment, the unbound or loosely bound particles are removed by washing with a solvent. In one embodiment, the solvent is water.

The anisotropic chain-like silica nanoparticles may be applied to the substrate in the presence of a solvent, a catalyst, or both. In one embodiment the solvent is a water-miscible organic solvent. In another embodiment, the solvent controls the electrostatic repulsion between the seed silica nanoparticles. In a further embodiment, the solvent is a lower alcohol, water, or any combination thereof. Lower alcohols include those alcohols having four or fewer carbons and include, but are not limited to, methanol, ethanol, propanol, isopropanol, butanol, n-butanol, isobutanol, sec-butanol, and tert-butanol.

The coating layer of the anisotropic chain-like silica nanoparticles on the substrate can be further enhanced by passivation as described above for the substrate.

The adhesion of the functionalized nanoparticles may be improved, without loss to hydrophobicity, with an addition of a low surface energy polymer on the substrate or wrap around nanoparticles. Suitable low surface energy polymers include, but not limited to, Cytop™ Teflon™, semifluorinated polymers, perfluoropolyethers, other fluoropolymers.

III. ARTICLES

Also provided herein are hydrophobic articles. These articles suitably include a substrate that is at least partially coated with the anisotropic chain-like silica nanoparticles described herein. In one embodiment, a portion of the substrate is coated with the layered coating described herein. In another embodiment, substantially all of the substrate is coated with the layered coating described herein. In a further embodiment, the entire substrate is coated with the layered coating described herein.

In one embodiment, an article is provided and comprises a layered coating described herein.

In another embodiment, a superhydrophobic and omni-transparent article is provided and may be prepared according to the methods described herein.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are described herein.

IV. EMBODIMENTS

The following listing of embodiments in intended to complement, rather than displace or supersede, the previous descriptions.

Embodiment 1

A layered coating adhered to a substrate surface, the layered coating comprising a layer of anisotropic chain-like silica nanoparticles bound, wherein said anisotropic chain-like silica nanoparticles comprise linked arrays of silica net-negatively charged nanoparticles, each linked array having at least one linear dimension of about 100 nm to about 1200 nm and said anisotropic chain-like silica nanoparticles each have a diameter of about 20 nm to about 80 nm; the substrate surface comprises surface active moieties carrying a net positive charge; said anisotropic chain-like silica nanoparticles are held to said surface by electrostatic charge; and the layered coating conforms to a surface topography defined by the anisotropic chain-like silica nanoparticles on the substrate.

Embodiment 2

The layered coating of Embodiment 1 which transmits greater than about 90% of incident light having a wavelength in a range of about 400 nm to about 800 nm.

Embodiment 3

The layered coating of Embodiment 1 or 2, wherein said substrate is glass, silicon, poly(dimethylsiloxane), polyester, polystyrene, poly(methyl methacrylate), poly(carbonate), plastic, fabric, or any combination thereof.

Embodiment 4

The layered coating of any one of Embodiments 1 to 3, wherein said surface active moieties carrying a net positive charge are amino groups.

Embodiment 5

The layered coating of any one of Embodiments 1 to 4, wherein said silica net-negatively charged nanoparticles comprises acid moieties.

Embodiment 6

The layered coating of any one of Embodiments 1 to 5, wherein the average cross sectional dimension of at least one the nanoparticles about 20 about 40 nm.

Embodiment 7

The layered coating of any one of Embodiments 1 to 6, which substantially resists condensation.

Embodiment 8

The layered coating of any one of Embodiments 1 to 7, which substantially resists fogging.

Embodiment 9

The layered coating of any one of Embodiments 1 to 8, wherein said topography is roughness.

Embodiment 10

The layered coating of Embodiment 9, wherein said roughness is about 20 to about 200 nm.

Embodiment 11

The layered coating of any one of Embodiments 1 to 10, which has a thickness of about 100 nm or less.

Embodiment 12

The layered coating of any one of Embodiments 1 to 11, wherein said surface active moieties are present in a layer on said substrate.

Embodiment 13

The layered coating of any one of Embodiments 1 to 12, wherein said layer comprising said surface active moieties is about 0.1 to about 3 nm in thickness.

Embodiment 14

A method of preparing a superhydrophobic and optically transparent layered coating, said method comprising, (a) functionalizing a substrate with surface active moieties carrying a net positive charge; (b) depositing a layer of anisotropic chain-like silica nanoparticles on said substrate by dip coating, drop casting or slot coating; and (c) washing the product of step (b) with solvent, wherein the anisotropic chain-like silica nanoparticles comprise linked arrays of silica net-negatively charged nanoparticles, each linked array having at least one linear dimension of about 100 nm to about 1200 nm and said anisotropic chain-like silica nanoparticles each have a diameter of about 20 nm to about 80 nm; the anisotropic chain-like silica nanoparticles are held to the surface by electrostatic charge; and the layered coating conforms to a surface topography defined by the anisotropic chain-like silica nanoparticles on the substrate.

Embodiment 15

The method of Embodiment 14, wherein said substrate is oxidized prior to step (a).

Embodiment 16

The method of Embodiment 14 or 15, wherein step (a) is performed using an alkoxylated silane or polyelectrolyte polymer.

Embodiment 17

The method of Embodiment 16, wherein said polyelectrolytic polymer is poly(diallydimethylammonium chloride) or poly allylamine hydrochloride.

Embodiment 18

The method of Embodiment 17, wherein said alkoxylated silane is aminopropyltrimethoxysilane, aminopropyltrimethoxysilane, aminobutyldimethylmethoxysilane, N-(2-aminoethyl)-3-aminopropyltrimethoxysilane, and 3-trimethoxysilylpropyl)diethylenetriamine, or any combination thereof.

Embodiment 19

The method of Embodiment 18, wherein said alkoxylated silane is 3-aminopropyltrimethoxysilane.

Embodiment 20

The method of any one of Embodiments 14 to 19, wherein step (a) is performed using chemical vapor deposition or in a solvent.

Embodiment 21

The method of Embodiment 20, wherein said solvent is acetone, toluene, water, or any combination thereof.

Embodiment 22

The method of any one of Embodiments 14 to 21, wherein step (b) is performed at a pH of about 5 to about 8.

Embodiment 23

The method of any one of Embodiments 14 to 22, wherein the concentration of anisotropic chain-like silica nanoparticles in step (b) is about 0.05 to about 1 wt %.

Embodiment 24

The method of any one of Embodiments 14 to 23, further comprising (d) introducing surface hydroxyl groups on said anisotropic chain-like silica nanoparticles.

Embodiment 25

The method of Embodiment 24, further comprising (e) reacting said hydroxyl groups with a fluorinated silane, fluoropolymers, short chain perfluorinated oligomer, or any combination thereof.

Embodiment 26

The method of any one of Embodiments 14 to 25, wherein said anisotropic chain-like silica nanoparticles comprise acidic functional groups.

Embodiment 27

The method of any one of Embodiments 14 to 26, wherein said anisotropic chain-like silica nanoparticles are prepared by (i) reacting a first portion of an alkoxy substituted silicate with an amino acid including arginine or glutamic acid in water to provide spherical silica seeds; and (ii) reacting about 1.5 to about 2.5 wt % of the spherical silica seeds with about 0.05 to about 0.5 wt % of the amino acid and about 0.5 to about 2.5 wt % of a second portion of said alkoxy substituted silicate in about 23 to about 83 wt % of aqueous ethanol.

Embodiment 28

The method of Embodiment 27, wherein step (i) further comprises a water-compatible solvent.

Embodiment 28

The method Embodiment 28, wherein said alkoxy substituted silicate is tetramethoxysilane, methyltriethoxysilane, methyltrimethoxysilane, tetraethylorthosilicate, or any combinations thereof.

Embodiment 29

A superhydrophobic and omni-transparent article prepared according to any one of Embodiments 14 to 28.

Embodiment 30

An article comprising a layered coating of any one of Embodiments 1 to 13.

The following Examples are provided to illustrate some of the concepts described within this disclosure. While each Example is considered to provide specific individual embodiments of composition, methods of preparation and use, none of the Examples should be considered to limit the more general embodiments described herein.

In the following examples, efforts have been made to ensure accuracy with respect to numbers used (e.g. amounts, temperature, etc.) but some experimental error and deviation should be accounted for. Unless indicated otherwise, temperature is in degrees C., pressure is at or near atmospheric

V. EXAMPLES

All of the chemicals were used without further purification and include 3-aminopropyltrimethoxysilane (APTMS) (99%, Aldrich), (heptadecafluoro-1,1,2,2-tetrahydrodecyl) trichlorosilane (99%, Gelest, Inc.), perfluorosilane, tetraethylorthosilicate (TEOS, $Si(OC_2H_5)_4$, 99%, Sigma-Aldrich Co.), ethanol 200 Poof (DECON Labs Inc.), and L-arginine (Sigma-Aldrich Co.). Si wafer (P type, polished) was purchased from University Wafer. Glass slides were purchased from Fisher (plain microscope slides, 3 inch by 1 inch by 1 mm).

The morphologies of the NP/NP films were imaged with an FEI Strata™ DB235 focused ion beam (FIB) SEM instrument. The DLS measurements of hydrodynamic diameter and zeta potentials of the particles were generated using Zetasizer® Nano S instrument (Malvern Instruments) from diluted article suspension (0.05 wt %) at pH 6. The surface topography of the samples was measured from a Bruker Icon® atomic force microscope (AFM) (Digital Instruments) with a $Si_3N_4$ cantilever in tapping mode.

The transmittance of the NP coated glass at different incidence angles was measured using SB4000 optical spectrometer (Ocean Optics). Bare glass was used as reference. The reflectance spectra with wavelength ($\lambda$) ranging from 400 nm to 850 nm were obtained from the F40 thin-film measurement system (Filmetrics) attached to an optical microscope with a spot size of 100 μm×100 μm.

Static and dynamic water contact angles were measured using a model 200 standard automated goniometer (Ramé-Hart) with sessile drop method. The static contact angle was measured from a 5 μL water droplets. Advancing and receding water contact angles ($CA_{adv}$ and $CA_{rec}$) were measured by automatically adding and removing water from the substrate with addition/removal rate of 0.125 μL/s respectively. All contact angle values were averaged over five different spots on each sample. For roll-off angle measurement, the substrate was placed on a custom-designed stage with a protractor attached to it, and a 10 μL water droplet was used. High speed movies for impinging drop experiments were taken with a high-speed camera (Phantom Ultra-high speed) with frame rate and exposure time at 1000 fps and 1 ms, respectively.

Water condensation behaviors on L-CNPs were imaged using an FEI Quanta 200 field emission gun (FEG) environmental scanning electron microscope (ESEM) at 30 kV voltage as described in Rykaczewski, *Microdroplet Growth Mechanism during Water Condensation on Superhydrophobic Surfaces.* Langmuir, 2012, 28(20):7720-7729, which is incorporated herein by reference. In brief, the chamber was first vacuumed to 1 Torr, and the Peltier was cooled to −12° C. After the temperature was stabilized, the pressure was gradually increased to about 4.5 Torr to enable the continuous condensation on the coating surface. During this step, the temperature of Peltier gradually increased to about −2.2° C. due to the heat released during the condensation. The sample was tilted at 75-85° and imaged at a scan rate of 1 picture frame/s to avoid heating and surface damage by the electron beam.

Example 1: Surface Functionalization of Silicon/Glass Substrates with Amino Groups The Si wafers/glass slides were pre-cleaned by sonication in acetone for 15 min, followed by rinsing with isopropanol, and dried by air gun. The substrates were oxygen plasma treated (30 W, 0.2 Torr, Harrick plasma cleaner PDC-001) for 30 min. The freshly oxidized Si wafers/glass slides were then treated with silanized with APTMS immediately by chemical vapor deposition (CVD) within a vacuum desiccator for 15 min to generate amino groups on surface. The excessive APTMS was removed by rinsing with ethanol for 15 s, and then water for 5 min, followed by drying with compressed air. The coated substrate was then heated to 120° C. for 30 min and stored in desiccator before further use. A 1.2±0.3 nm layer thickness was measured by a Vase® Ellipsometer (J.A. Woolam Co.), assuming APTMS has the same optical properties as $SiO_2$.

Example 2: Synthesis of Anisotropic Chain-Like Silica Nanoparticles

The anisotropic chain-like nanoparticles were synthesized based on controlled aggregation of seeds particles during growth step as described in Wang, Langmuir, 26(23):18491-18498, 2010, which is incorporated by reference.

To synthesize silica nanoparticle seeds (about 20 nm diameter), L-arginine (0.0566) was dissolved in deionized (DI) water (40.45 g) in a glass flask (125 mL) at room temperature. After heating the solution to 60° C., TEOS (4.2 g) was added to the L-arginine aqueous solution. The reaction solution was maintained at 60±0.5° C. with constant stirring rate for 24 h to complete the reaction. Homogeneous spherical silica seeds were characterized using dynamic light scattering (DLS) with a hydrodynamic diameter of 20±2 nm.

L-arginine (x g) was dissolved in water (y g) together with ethanol (64 g) and (z) spherical silica seed aqueous suspension (8 g—2 wt %). TEOS (1.0 g) then was added at temperature 60±0.5° C. See Table 1 for the values of x, y, and z. After 24 h, the nanoparticles were centrifuged (8000 rpm for 30 min, Eppendorf® Centrifuge 5804 R) and re-dispersed in DI water aided by sonication for 1 h.

TABLE 1

| Sample | x (g) | y (g) | z (g) |
|---|---|---|---|
| SPs | 0.1 | 10 | 6 |
| S-CNPs | 0.259 | 12 | 4 |
| I-CNPs | 0.259 | 10 | 6 |
| L-CNPs | 0.259 | 8 | 8 |

SEM was utilized to obtain images of the anisotropic chain-like silica nanoparticles. See, FIGS. 1A and 1B.

As shown above, synthesis of the CNPs from the spherical seeds involves two steps (FIG. 14A)—controlled assembly of spherical seeds in the presence of L-arginine in water/ethanol mixture, and the growth of $SiO_2$ layer over the assembled seed particles. The length of the chains is controlled by varying the concentrations of L-arginine, water, ethanol, and seed particles, respectively, and the amount of TEOS added during the growth step determines the particle diameter. Representative SEM images of the synthesized nanoparticles are shown in FIGS. 14B-14E, and the other characteristics are summarized in Table 2. Compared to SEM results, a similar increase of hydrodynamic diameter was observed from dynamic light scattering (DLS) measurements (Table 2, typically peaked at about 50 to about 150 nm), indicating a well-dispersed form of the nanoparticles in the aqueous solutions regardless of their forms. The suspension was also found highly stable over time—the intensity and peak wavelength from the DLS measurements barely shifted after the solutions were stored for a few months in the centrifuge tubes.

TABLE 2

| Sample | Dh (nm) | Zeta Potential (mV) | diameter (nm) |
|---|---|---|---|
| SPs | 60 | −40 ± 2 | 43 ± 3 |
| S-CNPs | 89 | −42 ± 2 | 50 ± 3 |
| I-CNPs | 128 | −45 ± 2 | 47 ± 3 |
| L-CNPs | 144 | −48 ± 2 | 44 ± 3 |

By controlling the stability of the seed particles during the growth step through controlling the solvent composition and L-arginine concentration, partially aggregated seed particles during the growth step led to formation of anisotropic CNPs with tunable chain length, denoted as S-CNPs, I-CNPs, and L-CNPs for short, intermediate, and long CNPs, respectively. When the aggregation state of the nanoparticle was low, nanoparticles had morphology close to peanut shape (see S-CNPs in FIG. 14C). As the growth condition became favorable to form highly aggregated particles, I-CNPs and L-CNPs with highly wiggly morphology and broad chain length distribution were formed (see FIG. 14D-E). Here, the diameter of the CNPs was tuned to be about 43-50 nm, similar to that of SPs (Table 2) and wetting properties of the coatings could be compared as a function of the chain length.

Example 3: Synthesis of a Coating of Anisotropic Chain-Like Silica Nanoparticle Films and their Hydrophobilization APTMS-silanized Si wafers/glass slides were immersed in a well-dispersed aqueous solution of anisotropic chain-like silica particles with concentration of 0.05 wt % at pH 6 for 1 min to 4 hours. The pH value of the suspension was adjusted by adding 0.1 mM sodium hydroxide (NaOH) or 0.1 mM hydrochloride (HCl) and monitored with a pH meter (Oakton Waterproof pHTestr 30). To generate coating with monolayer of nanoparticles, the coating process was performed under minimized ionic strength—no ionic species were added except for small amount of NaOH/HCl to adjust the pH of the suspension. For coating the spherical particles, a similar approach was applied to a spherical particle suspension with concentration of 0.01 wt % at pH 6 with coating time from 30 min.

After coating, the substrate was rinsed twice in DI water to remove loosely adsorbed particles. The substrate was then dried and subsequently treated with oxygen plasma (30 W, 0.2 Torr) for 30 min to introduce surface hydroxyl groups. The fresh samples were passivated by perfluorosilane (100 μL) placed in a vacuum desiccator on a separate plastic bowl for vapor deposition for 30 min. After perfluorosilane treatment, the coated substrate was heated up to 65° C. for 10 min to encourage chemical reactions between perfluorosilane and hydroxyl groups on nanoparticles. The substrate was rinsed in acetone and water subsequently to remove the excessive perfluorosilane on the surface. The significantly increased water contact angle results suggested that the chain-like silica nanoparticles were successfully passivated by the perfluorosilane. It is hypothesized that the negatively charged silica nanoparticles bind to the substrate through electrostatic interactions with the positively charged amino groups from APTMS-silanized Si wafers/glass slides. See, FIG. 1C, which is a schematic description of this embodiment.

Figure 2A:
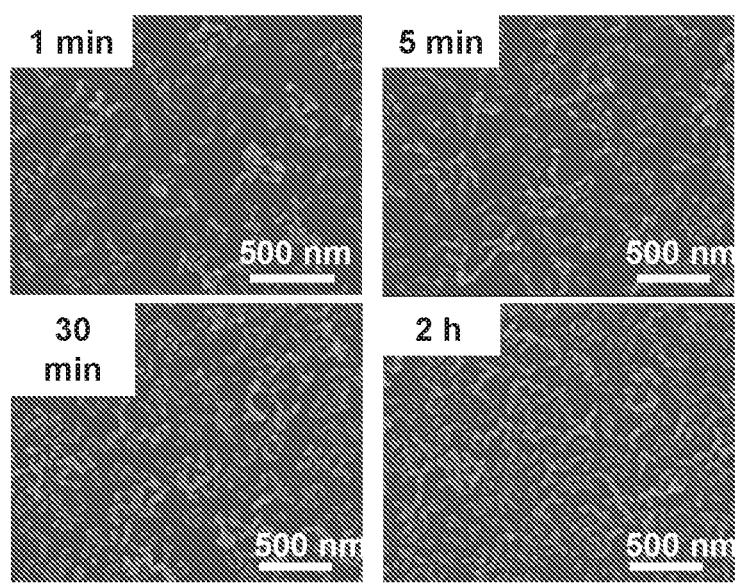
FIG. 2A are SEM images of anisotropic chain-like silica nanoparticles coated on a substrate at a pH 6 for different periods of immersion, e.g., 1 minute, 5 minutes, 30 minutes, and 2 hours.
Figure 2B:
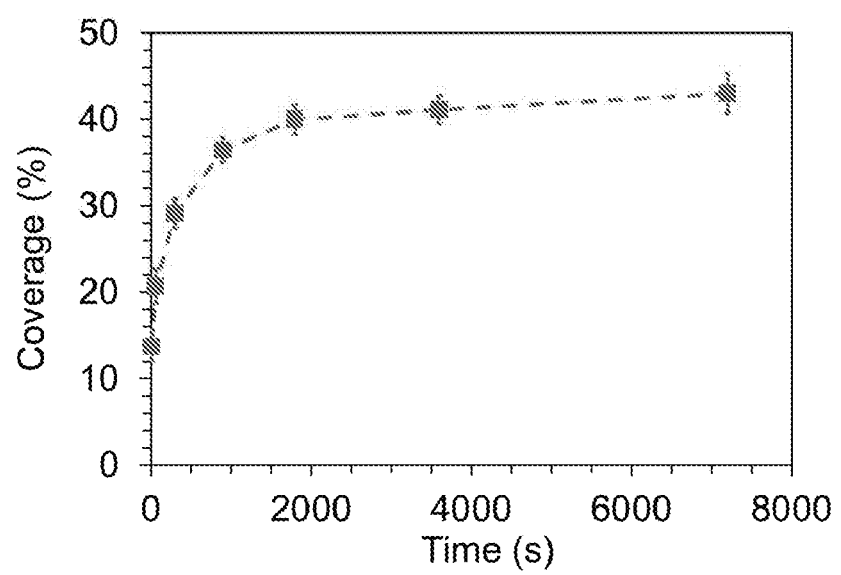
FIG. 2B is a plot of coating coverage (%) vs. coating time (seconds) for a sample where coverage was estimated from SEM images at five different locations on the substrate. The standard deviation is noted as an error bar.

The results also illustrate that the coating morphology (and thus surface roughness) and coverage may be dependent on pH of the solution. Specifically, the formation of the coating was monitored by SEM at for different coating durations. FIG. 2A shows the coating morphology obtained from soaking in a pH 6 aqueous suspension consisting of 0.05 wt % nanoparticles for different coating durations. The time dependence of the coating coverage is plotted in FIG. 2B, which clearly showed self-saturation of the coating process.

Example 4: Surface Roughness Analysis

Figure 3:
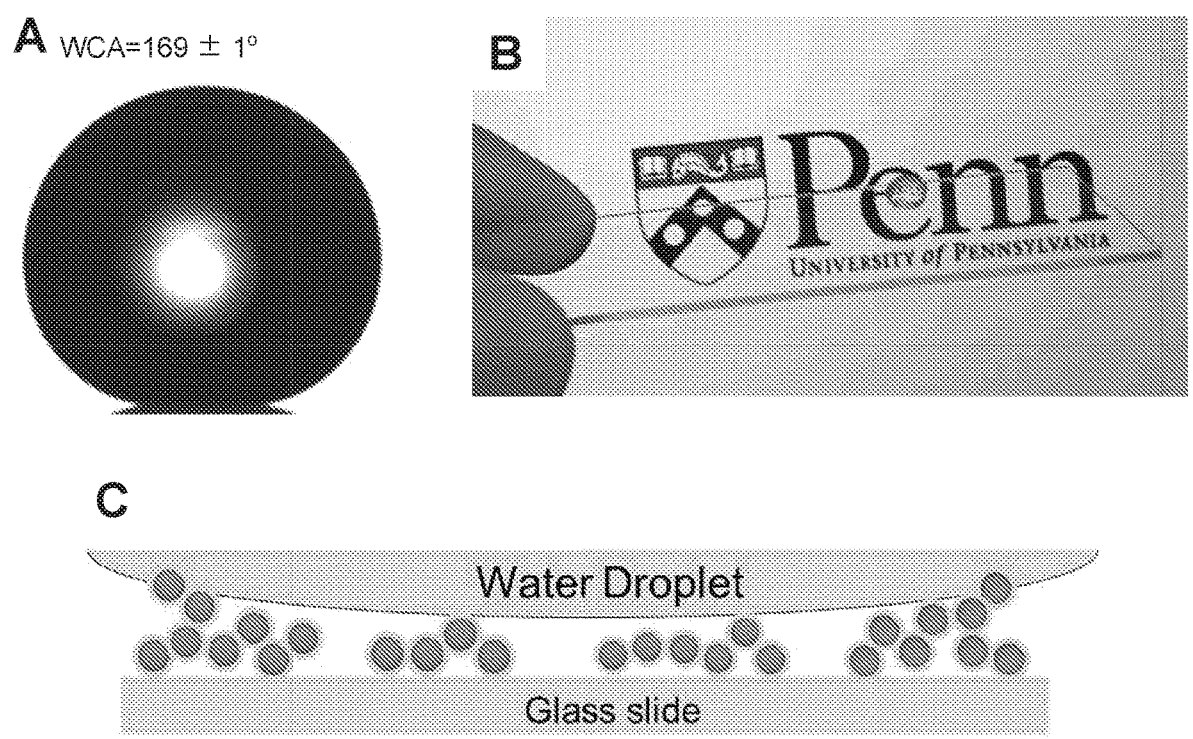
FIG. 3A is a water droplet (3 µL) on a coated glass substrate with a water contact angle of 169°.
FIG. 3B is an optical image showing a coated glass slide with 20 µL water droplets on top and in front of a LCD screen.
FIG. 3C is a schematic illustration of a water droplet sitting on the nanoparticle coating.

High surface roughness with 3D topography is beneficial for superhydrophobicity with high WCA and low CAH. The coated substrate of Example 3 exhibited a high apparent WCA of 169±1° (FIG. 3A) and low CAH of about 2°, indicating Cassie-Baxter non-wetting state. These data illustrate that the water droplet on the coated surface is highly mobile. Specifically, a 10 μL water droplet can roll off the substrate at a sliding angle of less than about 1°.

According to the Cassie-Baxter model, the enhanced apparent contact angle can be attributed to the air trapped in the grooves between the rough surface, leading to reduced contact area between the liquid and solid at the composite interface. As a result, water droplets can easily roll off the surface. See, Cassie and Baxter, Transactions of the Faraday Society, 40(0):546-551, 1944.

$$\cos \theta_{CB} = -1 + f(\cos \theta_0 + 1) \quad (1)$$

where:
f=area fraction of the solid in contact with the liquid
$\theta_0$=Young's contact angle on a flat surface.

To better understand the implication of the improved water repellency to the solid-liquid interaction, the CA results were converted into normal and shear adhesion factors (FIG. 15B), which are dimensionless parameters proportional to the forces required to vertically detach and shear the water droplets from the coating surface, respectively.

$$\text{Normal adhesion factor: } x = 1 + \cos \theta_{rec} \quad (2)$$

$$\text{Shear adhesion factor: } y = \cos \theta_{adv} - \cos \theta_{rec} \quad (3)$$

Figure 15:
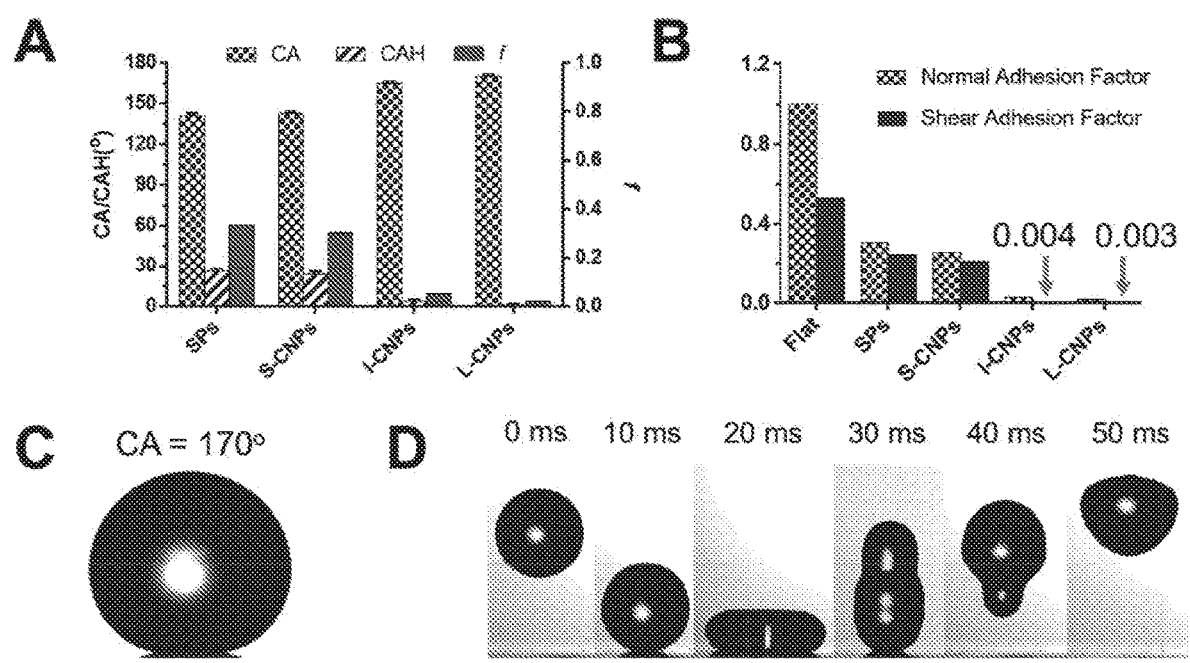
FIG. 15A is a bar graph showing the WCA, CAH, and filling fraction (f) of solid on the composite surface from coatings assembled from different nanoparticles. f is estimated by equation 1.
FIG. 15B is a bar graph showing the adhesion factors obtained from equations 2 and 3 on different coating surfaces.
FIGS. 15C-D are optical images of the 5 μL water droplet sitting on the L-CNP coating surface (FIG. 15C), and rebound of 6 μL water droplet from a 2 cm height (FIG. 15D).
Figure 16:
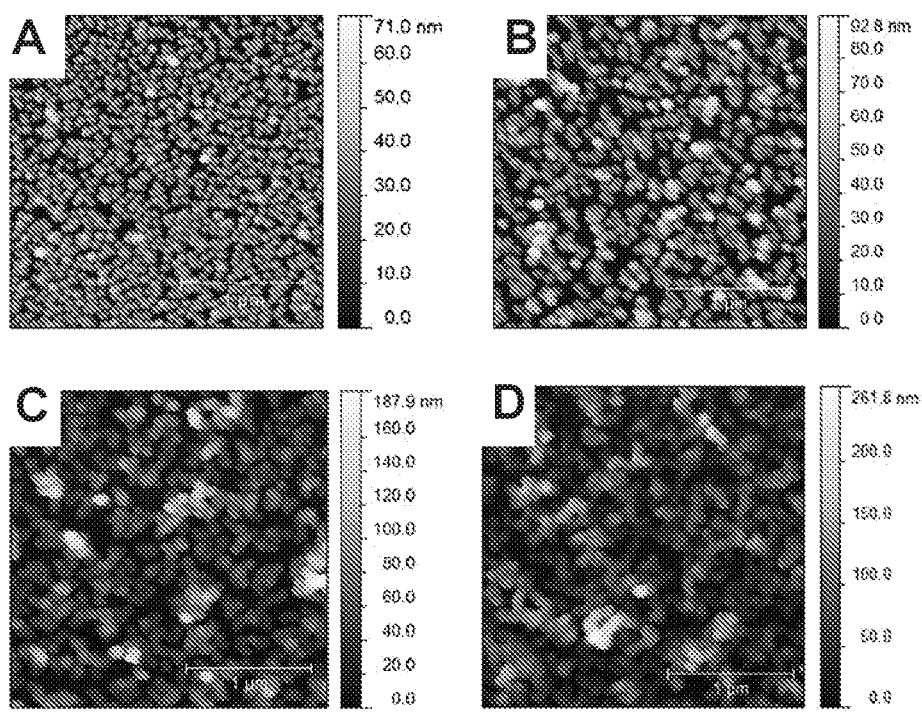
FIGS. 16A-D are AFM images of the coatings assembled from different nanoparticles: SPs (FIG. 16A), S-CNPs (FIG. 16B), I-CNPs (FIG. 16C), and L-CNPs (FIG. 16D).

The flat surface is the glass slide treated with perfluorosilane. As seen in FIG. 15B, water adhesion to NP coatings decreased significantly due to the formation of the composite interfaces. It is noted that as the chain length of the CNPs reached a threshold, the water adhesion dropped dramatically, and became almost vanished on the L-CNPs. When compared to the adhesion parameters of the SP coating, the shear adhesion of water on the L-CNP coating surface decreased by about 50 times, and normal adhesion decreased by about 10 times. Compared to those of the flat substrate coated with fluorosilane, both adhesion factors on L-CNP coating decreased by more than 100 times. These results are consistent with the significantly reduced f estimated from equation 1 (FIG. 15A), where the decreased adhesion is associated to the reduced contact between liquid and solid. Using the measured average static WCA values of about 169° and about $\theta_0$=113° on nanoparticle coated and perfluorosilane functionalized smooth surfaces, respectively, it was estimated that the coated surface has an extremely low contact fraction with liquid (f=0.03). Experimentally, due to the complexity of surface morphology and nanosized particles, it was impossible to directly visualize the wetting state associated to the nanoparticle coating structures. However, a low value of f compared to the overall surface coverage of particles (typically >30% for those achieving superhydrophobicity) clearly indicates that the water droplets only contact a very small portion of the silica nanoparticle surface (see the schematic in FIG. 3C).

In addition to achieving Cassie-Baxter state of non-wetting, it is also important to achieve robust Cassie-Baxter state for practical applications, i.e., it is necessary need to prevent the wetting transition from the Cassie-Baxter state to the Wenzel state under external perturbations, including mechanical impact from rain droplets, hydrostatic pressure, and water condensation from vapor phase at a high humidity environment. See, e.g., FIGS. 13A-C. Often such a transition is irreversible; once liquid imbibes into the grooves of the composite surface, it is difficulty overcome the energy barrier for water to climb out of the grooves, therefore, the surface loses water repellency. Specifically, when the applied pressure difference between the liquid droplets sitting on the surface and the underlying gas phase arising from, e.g., droplet impact or Young-Laplace pressure, reaches a critical value, wetting transition occurs. This value is defined as the critical breakthrough pressure $P_c$, that is, the maximum pressure difference that the liquid/air interface can sustain. Previous studies revealed that $P_c$ is highly dependent on the microstructure on the coating surface.

To achieve highly stable Cassie-Baxter state, the surface should possess hierarchical structures that combine nano- and micro-surface roughness or high aspect ratio and dense nanostructures. Interestingly, it was found that the nanoparticle coatings described herein were highly stable despite of the fact that the surface roughness was predominantly in the nanoscale with the average coating thickness less than 100 nm.

Example 5: Surface Topography Nanotextures

Since the wetting behaviors are highly dependent on the nanotexture of the coating, the surface topography of the coatings was scanned by AFM. In an effort to ensure that the AFM images in the scanned area can represent the overall coating morphology, for each sample, five scans in the area of 2.5 μm by 2.5 μm were taken at different locations. See FIGS. 16A-16D. Root mean square ($R_{RMS}$) surface roughness and average coating thickness were calculated and compared from different locations for each sample to ensure that the scanned area represented the overall surface topography of the entire coatings. See FIGS. 6F, 7A and 7C.

Example 6: Impact Experiments

To quantify the robustness of the non-wetting behavior of these surfaces, water droplet impact experiments were performed by dropping water (20-25 μL, radius about 1.7-3.6 mm) onto a glass surface coated as described in Example 3 to mimic rain-droplets in an outdoor environment.

A. Experiment 1

The water droplets were dropped from about 1 meter in height at a tilted angle of about 30° reaching the coating surface at a speed of v=4.5±0.1 m/s. In a storm, the speed for rain droplets of similar size reaching the ground is estimated about 8 m/s (Spilhaus, Journal of Meterology, 5(3):108-110, 1948).

Modeling of the water droplet impact on a flat or nanotextured surface suggested that there are two states of wetting pressure generated during impact. See, McCarthy, Applied Physics Letters, 100(26):263701, 2012 and Deng, Applied Physics Letters, 94(13):133109, 2009. An initial impact generates a water hammer pressure ($P_{WH}$) about $0.2\rho cv$, where $\rho$ is the density of water, c is speed of sound in water, and v is impact velocity at the initial contact of droplet to the surface. At v=4.5 m/s, $P_{WH}$=1.35 MPa. As water spread over the surface, a lower hydrodynamic pressure was generated, $P_B$ of about $0.5\rho V^2$=10 kPa. It was noted in Deng cited above that in order for the impacting water droplet to fully dewet from the surface after impact, the critical breakthrough pressure $P_c$, that is, the maximum pressure difference that the liquid/air interface can sustain, should be at least on the same order of magnitude of $P_{WH}$, i.e., $P_c$ should be >1 MPa utilizing the coating described herein, to exhibit complete dewetting of the impact droplet from the coating surface. However, McCarthy compared the theoretical $P_c$ with respect to $P_D$ in micro-pillar arrays system and found that the value of $P_c$ is 1 or 2 orders of magnitude bigger than $P_D$, but not necessarily bigger than $P_{WH}$ to exhibit complete dewetting of the impact droplet. It is estimated that the $P_c$ on the coated surfaces described herein is about 100 kPa to 1 MPa, which is about 100 to 1000 times higher than that of typical superhydrophobic surfaces composed of micropost arrays with $P_c$=1 kPa (Reyssat, Europhys. Lett., 74(2):306-312, 2006). Therefore, the coating of Example 3 is highly stable against impact.

The robustness of Cassie-Baxter state of wetting on the two-tier nanostructures was studied against hydrodynamic pressure and hydrostatic pressure. For water drop impacts, it has been shown that increasing the velocity beyond a critical value will cause water droplet pinned on superhydrophobic surfaces. Particularly, the kinetic energy of the water drop can overcome the energy barrier between the suspended Cassie-Baxter state and the pinned Wenzel state, which is defined by the anti-wetting capillary pressure of the smallest length-scale structure present on the surface. The external pressure generated from the impacting water droplet is characterized by two scales of the pressures, i.e., $P_{HW}$, and $P_B$:

$$P_{WH} \sim k\rho cv \quad (4)$$

$$P_B \sim 0.5\rho v^2 \quad (5)$$

where $\rho$ is the density of water, c is the speed of sound in water, v is the impact velocity, and k is a pre-factor on the order 0.2 depending on surface topology of the superhydrophobic surface. $P_{HW}$ is associated to the events of shock wave (i.e., water hammer effect) generated within the initial impact zone. $P_B$ is associated to the Bernoulli pressure during spreading of the liquid over the SH surface. $P_{HW}$ can be as large as a few MPa due to the water hammer effects, and thus it can easily induce local impregnation of water on most superhydrophobic surfaces.

B. Experiment 2

Water droplets with different volumes (about 5 to about 25 μL) were dropped from varying heights as described in Experiment 1, but using varying speeds, onto a coating substrate prepared as described in Example 3. See, Table 3 and equations 4 and 5.

TABLE 3

| Height (m) | Speed (m/s) | $P_{WH}$ (MPa) | $P_B$ (kPa) | Completely Repel |
|---|---|---|---|---|
| 0.5 | about 3 | about 0.9 | about 4.5 | Yes |

TABLE 3-continued

| Height (m) | Speed (m/s) | $P_{WH}$ (MPa) | $P_B$ (kPa) | Completely Repel |
|---|---|---|---|---|
| 1 | about 4.5 | about 1.3 | about 10 | Yes |
| 3 | about 7 | about 2.1 | about 24 | Yes |
| 6 | about 8 | about 2.4 | about 32 | Yes |

For water droplets impinged from heights of 0.5 m and 1 m, the dynamic process was recorded by a high-speed camera and the speed measured based on recorded frames. The process of the surface to completely repel the water droplet can be identified as splash and fully recoil of the impinging water drop from the surface.

For water droplets impinged from heights of 3 m and 6 m, the samples were examined afterwards to determine if any liquid was sticky to the coating surface and the speed of water droplet was estimated as described in van Boxel, Numerical model for the fall speed of rain drops in a rain fall simulator, I.C.E. Special Report, 1998/1, 77-85, which is incorporated by reference. No water pinning effect was observed from impinging water at a speed up to about 8 m/s, which was approaching the terminal speed of the water droplet tested in the experiments or the speed of rain in a storm.

Figure 9:
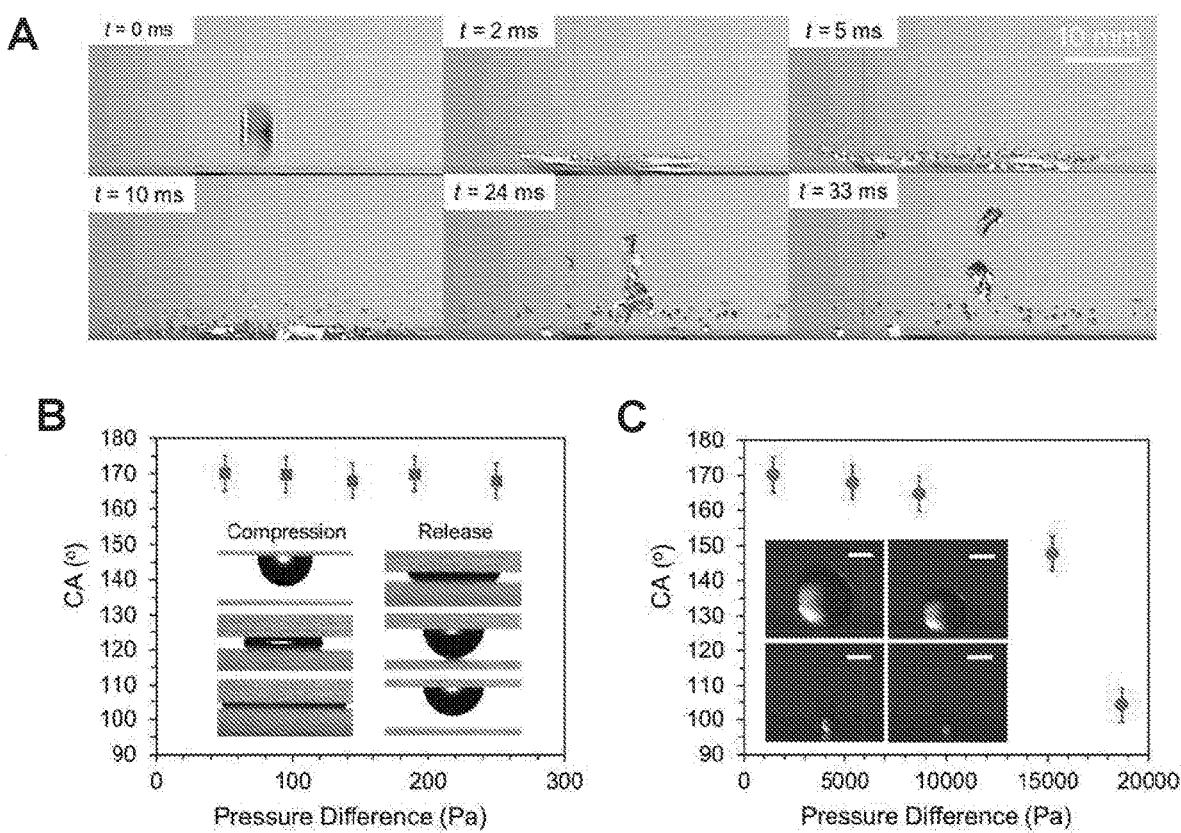
FIG. 9A are sequential video frames of 25 µL water droplets impacting the coated glass surface at a speed of about 4.4 m/s.
FIG. 9B are plots showing the CAs during compression and release of the L-CNP coated surface to a perfluorosilane treated flat substrate. The inset includes optical images taken during the compression and release process.
FIG. 9C is a plot showing the CA of evaporating small water drops on the L-CNP coating surface vs. the internal Laplace pressure against the composite interface. The inset are optional images showing the evaporating water micro-droplet. Scale bar: 20 µm.

FIG. 9 are sequential video frames of 25 μL water droplets impacting the coated glass surface at a speed of about 4.4 m/s. These data suggest the absence of liquid pinning for droplets hitting the substrate described herein, even at a speed up to about 8 m/s. Clearly, the superhydrophobicity on chain-like NP coating is highly stable against water drop impingement found in daily life.

C. Experiment 3

To quantify the robustness of the superhydrophobic NP coatings, two experiments were performed by applying hydrostatic pressure as described in Lafuma, Superhydrophobic states, Nat. Mater., 2003, 2(7):457-460 including (a) compression experiments by squeezing water droplets between two surfaces, and (b) evaporating small water droplets on the coating surface. FIG. 9B shows compression of a 5 μL water droplet between the superhydrophobic surface and a flat hydrophobic surface treated with perfluorosilane up to a small separation (about 0.15 mm). The applied pressure to the composite interface was deduced using the Laplace equation 6:

$$\Delta P = \frac{\gamma(\cos\theta_b + \cos\theta_t)}{x}, \text{ for } x << R \quad (6)$$

where γ is the water-vapor surface tension, $\theta_b$ and $\theta_t$ are the contact angles at the bottom and top surfaces upon compression, respectively, and R is the radius of the water drop. For each ΔP, the receding WCAs on the L-CNP coating surface was measured as the bottom plate was relaxed. During the relaxation, water droplets were not observed to be stuck to the L-CNP coating and the receding contact angle of the water droplet maintained above 165°, confirming that Cassie-Baxter state was maintained. To reach even higher hydrostatic pressures, small water drops were deposited to the surface using a water spray bottle with initial radii of about 30 to 50 μm. At this length scale, the gravitational force becomes negligible, and the internal pressure, ΔP, applied to the composite interface is given by the Laplace equation $\Delta P=2\gamma/R$. As water drops evaporate, hydrodynamic pressure applied to the composite interface is increased due to the shrunk drop size. To capture the dynamic process of evaporation, side-view images from water drop were obtained under the optical microscope. As seen in FIG. 9C, the water droplet remained nearly spherical until its radius reached about 7 µm.

To compare the Cassie-Baxter state stability of the coatings with existing literature during droplet evaporation, the relationship between CA of the water drop and the internal Laplace pressure due to the shrunk drop size was determined. For the evaporating water drop as shown in FIG. 9C, CA decreased to about 150° when the internal pressure reached about 15 kPa and to about 105° at a pressure of 17 kPa. These results suggest that a maximum sustainable pressure difference of the composite interface can be in the range about 15 to about 17 kPa. Evaporation of multiple water drops on the coating surface was monitored—the critical pressure that the composite interface sustains was found varied slightly from about 15 kPa to about 20 kPa. The small difference could be attributed to the local variation of the nanoparticle coating when the contact-line dimension is comparable to the dimension of spacing between the nano-asperities. In comparison, on other superhydrophobic surfaces (e.g. micro-structures, artificial hierarchical structures, and lotus leaf), significant drop of WCA occurs at much smaller internal pressures, ranging from about 200 Pa to about 2 kPa.

Example 7: Nucleation and Condensation Monitoring

Besides mechanical impact, water vapor condensation is another reason that often induces the transition from Cassie-Baxter state to Wenzel state. Nanometer-sized water droplets can be nucleated within the grooves between the nanoparticle assembly. Depending on the growth of the condensing water and subsequent coalescing process, the condensed water droplets can either fully/partially imbibed into the surface roughness to form Wenzel/partial Wenzel state of wetting and become sticky to the surface, or remain non-wetted in the Cassie-Baxter state such that the condensed water droplets can be easily removed. Since condensation of water on coating surfaces usually occurs in outdoor environments, e.g., during dew formation, it is important to design superhydrophobic surfaces that can repel water through condensation to the surface.

Figure 4:
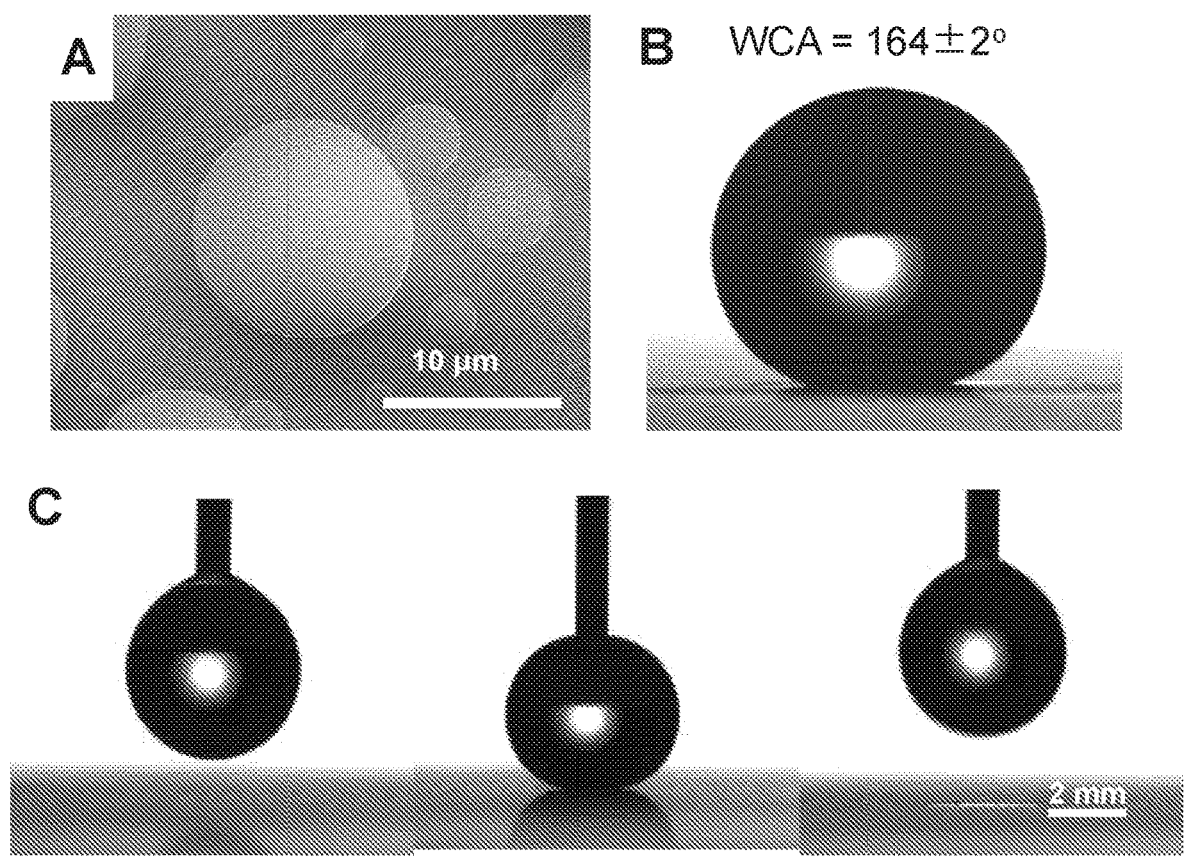
FIG. 4A is a SEM image of water condensation in an environmental SEM forming micro-droplets of water.
FIG. 4B is an optical image of a macro-droplet (5 µL) of water placed on an anisotropic chain-like silica nanoparticle coated glass with a thin layer of condensing water film on top at a water contact angle of 164±2°.
FIG. 4C is an optical image of the macro-droplet in contact with the coating deposited with condensing water micro-droplets.
Figure 10:
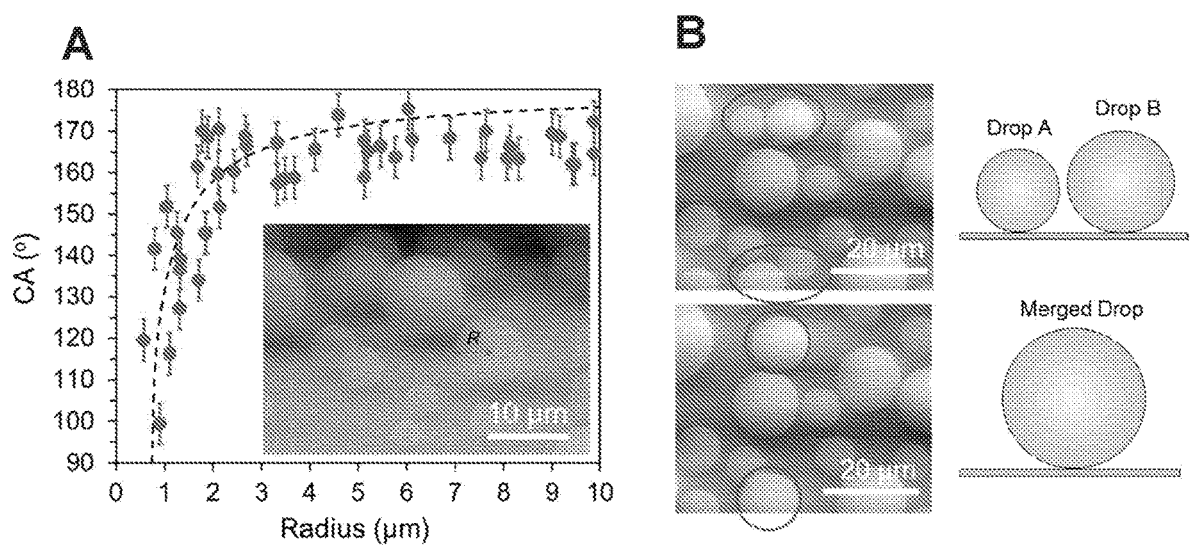
FIG. 10A is a plot of water contact angle vs. the radius of the condensing water droplets. Inset: SEM images of the condensing water droplets.
FIG. 10B (left) are images showing water condensation on L-SNP coating under an environmental scanning electron microscopy (ESEM) at aforementioned condition: observed merging of micro-drops on the coating surface, which remains spherical (i.e. high contact angle), indicating the high water repellency is maintained on the coating surface during water condensation. The circles show the water drops before and after merging.

Nucleation and condensation under environmental SEM were thereby investigated using the coated substrate prepared in Example 3. FIG. 10A shows an SEM image of water condensation in an environmental SEM, forming micro-droplets of water. As seen in FIG. 4B, at −6.3° C. and 3 Torr water vapor pressure, spherical micro-droplets of water (diameter <5 µm) were formed on the coating substrate having a water contact angle of about 164±2°. The coalesced micro-droplets could move and merge together, forming a larger spherical droplet, indicating high mobility of the condensed micro-droplets on the surface (FIG. 10B).

When the coated substrate was cooled to 4° in an ambient environment with relative humidity 20%, the formation of a thin layer of condensing water on the coating surface was observed. However, the WCA remained as high as 164°, suggesting the condensed water film had negligible effect on the wetting properties. Meanwhile, the condensed water film barely adhered to the surface. When touched by a water droplet (3 µL), the condensed water at the coated region was easily taken away and coalesced into the macro-droplet (FIG. 4C).

Example 8: Film Transparency

A. Experiment 1

In addition to the remarkable water-repellency shown from the chain-like nanoparticle assemblies, the coated substrate of Example 3 also demonstrated omni-transparency from different incidence angles in the visible to near infrared (NIR) wavelength range when contacted with water. As seen in FIG. 5A at normal incidence of light, the double-side coated glass slide (about 95% transmittance) transmitted about 4.3% more light on average in the visible wavelength than the uncoated one (about 90.7% transmittance).

The omnidirectional transparency of these coatings was investigated by measuring transmittance at variable incidence angles ranging from 0 to 70° at a fixed wavelength, 500 nm. As seen in FIG. 5B, all of the coated surfaces showed higher transmittance than the corresponding uncoated ones. The inset in FIG. 5B provides a photograph of a glass slide with the left side coated as described in Example 3 and placed at an angle of 60° with respect to a computer screen.

Figure 7:
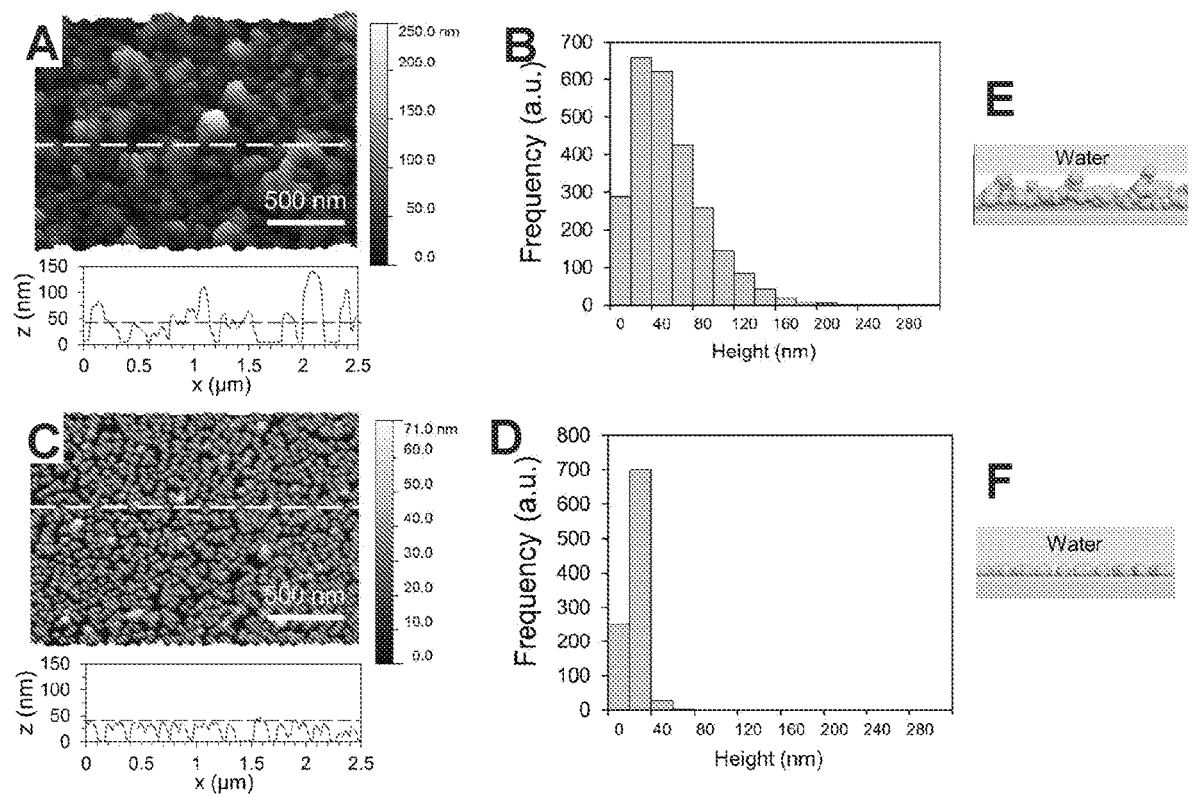
FIGS. 7A-D compare the surface topography of the coatings formed from string-like particles with spherical particles.
FIGS. 7E-F are schematics showing the wetting mechanism on spherical particles vs. wiggly CNPs.

A comparison of wavelength-dependent specular reflectance of fused glass substrates with and without the nanoparticle coating described in Example 3 was analyzed. FIG. 7C (left axis) notes that the coated glass of Example 3 had less reflectance than the uncoated glass. To the left of FIG. 5D are optical images of the coated and uncoated glass slides, showing significantly reduced reflectance on the coated glass slide which may be attributed to the attenuated refractive index contrast in the chain-like nanoparticle coating as shown in the schematics on the right of FIG. 5D.

The enhanced light transmission may be attributed to the reduced reflection (FIG. 5C) on the coated glass slides as a result of intermediate effective refractive index of the particle coating on the air/glass interface (FIG. 5D). The appropriate coating thickness and gradient filling-fraction of the particles along z-direction may be responsible for the pronounced anti-reflective effects on the coating, from 9.3% on average on uncoated glass slide to 4% on double-side coated glass slides in the visible wavelength of light.

The anti-reflective behavior on the coating prepared in Example 3 was also found comparable to the commercial monolayer based anti-reflective coating prepared as described in Raut, Energy & Environmental Science, 4(10): 3779-3804 (2011).

B. Experiment 2

Figure 8:
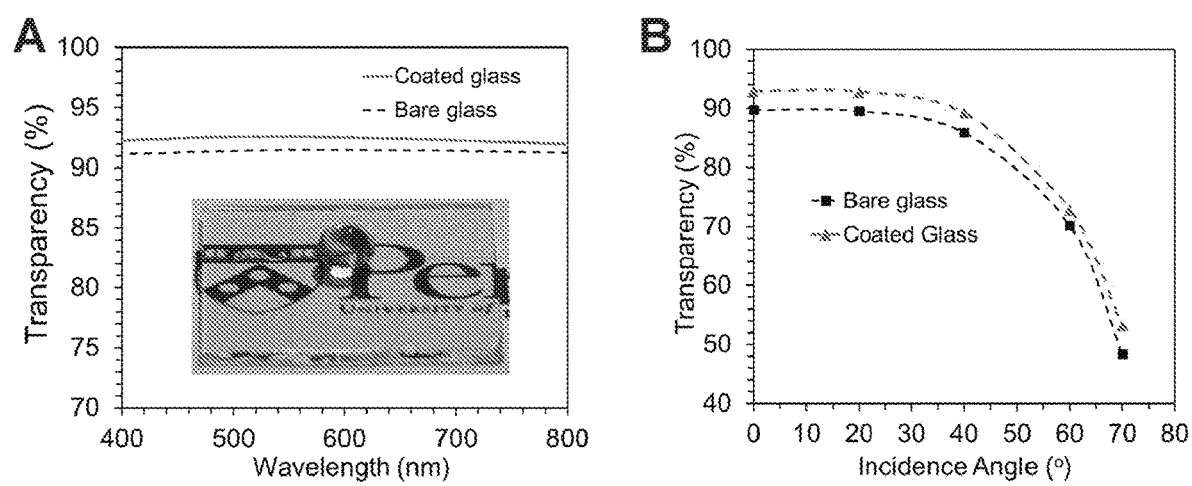
FIGS. 8A/B illustrates the optical characterization of the nanoparticle films coated on glass slides.
FIG. 8B is the transmission spectrum showing the average transmittance in the wavelength range from 400 nm to 800 nm of SNP coatings (■—pH 6, 0.05 wt % nanoparticle suspension immersed for 2 h) vs. uncoated glass slides (▲) from different incidence angles (i.e. 0°, 20°, 40°, 60°, and 70°).

APTMS-silanized Si wafers/glass slides were immersed in a well-dispersed aqueous solution of anisotropic chain-like silica particles with concentration of 0.05 wt % at pH 6 for 2 hours. After coating, the substrate was then treated using the procedure of Example 3. As discussed above, the coated substrate also demonstrated omni-transparency from different incidence angles in the visible to near infrared (NIR) wavelength range when contacted with water. As seen in FIG. 8A at normal incidence of light, the single-side coated glass slide (about 92% transmittance) transmitted about 1.3% more light on average in the visible wavelength than the uncoated one (about 90.7% transmittance).

The omnidirectional transparency of these coatings was investigated by measuring transmittance at different incidence angles (i.e. 0°, 20°, 40°, 60°, and 70°) at wavelengths ranging from 400 nm to 800 nm. As seen in FIG. 8B, all of the coated surfaces showed higher transmittance than the corresponding uncoated ones. The inset in FIG. 8A provides a photograph of a glass slide coated as described above with a water droplet sitting on the surface beading up to spherical shape.

The two-tier morphology of L-CNP coating is ultrathin, less than 100 nm. Therefore, the coating is not only superhydrophobic but highly transparent (FIGS. 8A and 8B). The transmittance of L-CNP coating in the visible to near infrared (NIR) regions was found slightly higher than that of the bare glass (FIGS. 8A and 8B), which is attributed to the effects reduction of Fresnel reflection on the coating surface due to the intermediate refractive index obtained on the coated nanoparticles. The optical transparency of the coating at normal incidence is shown in FIG. 8A. The average transparency of the coating and bare glass between wavelength 400 nm and 800 nm is shown in FIG. 8B. In both cases, the coated glass slide is more transparent than the non-coated slide.

Example 9: Film Haze

One additional parameter often employed in characterizing the optical properties of coatings is haze, defined as the percentage of diffuse transmission due to wide-angle scattering vs. total transmission. High scattering from the coating surface can cause opaqueness of the film and reduction of clarity, even when the transmission is still high.

Accordingly, the degree of scattering from the nanoparticle coating was estimated by examining the difference between the sums of transmittance (T) and reflectance (R), $(T+R)_{uncoated}$ $(T+R)_{coated}$ (FIG. 5C), assuming absorption and scattering from the glass slide itself is negligible. These results show that the coated glass has less scattering than the uncoated glass and the average scattering loss in the visible wavelength for the double-side coatings was about 1.1% or 0.55% loss per side of coating, confirming negligible scattering and high clarity nature of the coatings described herein. It was also found that the scattering became much less pronounced in the longer wavelength, which could be explained by the reduced Rayleigh scattering factor at the long wavelength (I=about $1/\lambda^4$).

Example 10: Particle Morphology Comparison

This example was performed to evaluate the coating formed by silica nanoparticles having different morphologies. Charge induced adsorption of nanoparticles in aqueous solution was utilized (FIG. 6A), where the electrostatic repulsion between particles led to self-limiting deposition to form a monolayer of nanoparticles on the substrate, while the asperity of the coating was determined by the chain length. Here, the nanoparticles had negative zeta-potentials at pH 6, while the substrate coated with aminosilane exhibited a positive charge. The substrate deposited with nanoparticles was passivated by perfluorosilane (about 1-2 nm thick, confirmed by ellipsometry) to achieve hydrophobic surface chemistry.

Specifically, 0.05 wt % of spherical nanoparticles (SPs), short-chain nanoparticles (S-CNPs), intermediate-chain nanoparticles (I-CNPs), and long-chain nanoparticles (L-CNPs) were coated on APTMS treated substrate separately at a pH of 6, followed by the same procedure of Example 3 to treat perfluorosilane. See, FIGS. 6B-E showing different morphologies of the particles. FIGS. 6F-G shows that escalating the anisotropic nature of the nanoparticles results in surface with higher mobility of water on the coating surfaces. Specifically, FIGS. 6F-6G show that, when the chain length of the nanoparticles increased, both $R_{RMS}$ and the average nanoparticle thickness ($h_{avg}$) was also increased given similar coverage of the particles to the substrates. The average thickness of the coating increased from 22±3 nm (on SP coating) to 48±5 nm (on L-CNP coating), and the $R_{RMS}$ increases from 11±1 nm (on SP coating) to 36±3 nm (on L-CNP coating). See FIG. 6F.

Upon saturation in the aqueous solutions for 120 min, four different types of nanoparticles, including SPs, S-CNPs, I-CNPs, and L-CNPs, as seen in FIG. 15A, offered similar coverage of nanoparticles on the substrates: SNPs—43±2%, S-CNPs—41±4%, I-CNPs—42±4%, and L-CNPs—43±4%. However, their WCA and CAH were drastically different (FIG. 15A). All four coatings exhibit improved water mobility and repellency compared to the flat glass surface treated with perfluorosilane (WCA=110±1°, and CAH=30±2°). Superhydrophobicity was achieved when the length of the CNPs was increased (FIG. 15A). WCAs of 141±2° and 143±1° were obtained from SNP and S-CNP coatings, respectively, whereas the CAH remained large, 26±2° and 24±2° for coatings from the assemblies of SNPs and S-CNPs, respectively). Water droplets could not rebound after dropping them from a 2 cm height. In contrast, the WCA approached 170° and CAH decreased to 3±1° and <1°, respectively on coatings assembled from I-CNPs and L-CNPs. As shown in FIG. 15C, the water droplets could rebound after hitting the surface from a 2 cm height.

Figure 17:
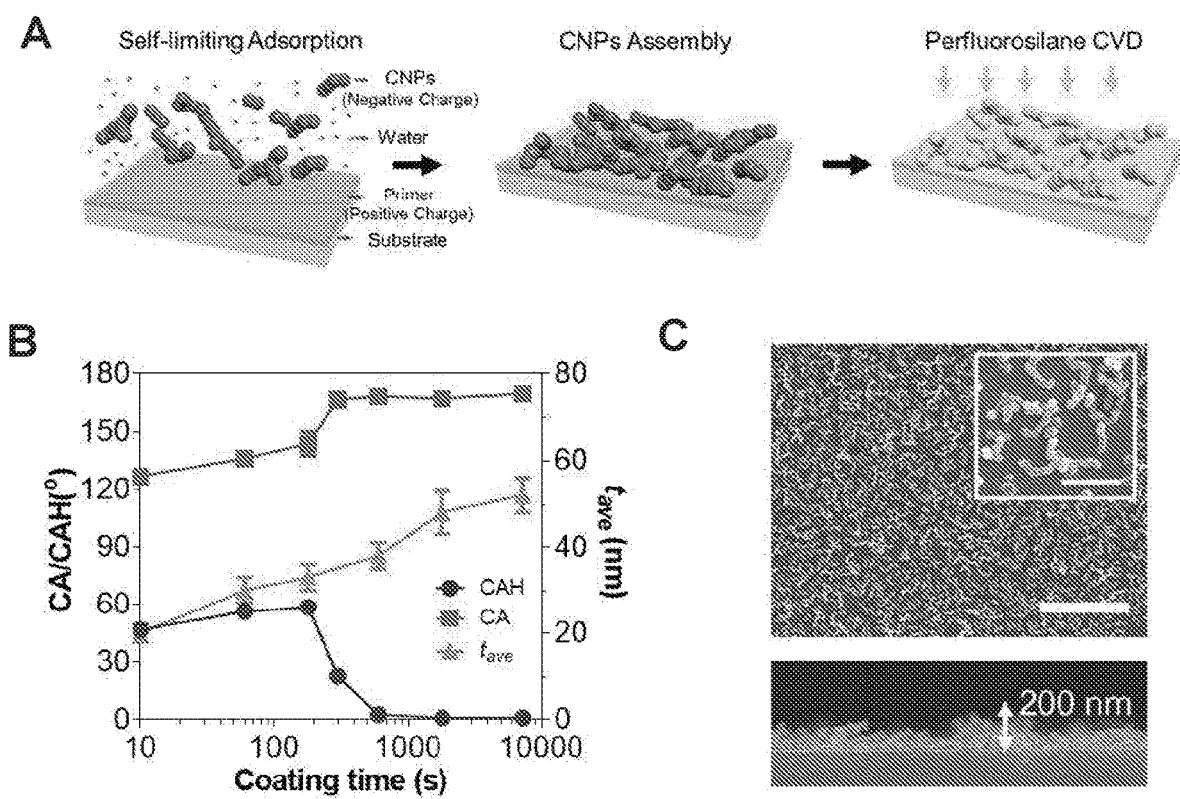
FIG. 17A is the schematic showing the deposition of nanoparticles via the charge induced adsorption.
FIG. 17B is a line graph showing the WCA, CAH, and average thickness of the coating at different deposition time of the CNPs, where the CA start to reach 170° and CAH reach about 1° as the average coating thickness approaching 50 nm.
FIG. 17C are top and side-view SEM images of the coating formed from immersing APTMS functionalized glass in 0.05 wt % L-CNP particle aqueous suspension at pH=6 for 30 min.

In FIG. 17A, WCA, CAH, and average thickness of the coating surface was plotted against the coating time for L-CNPs. It was observed that as the coating thickness reached about 50 nm, the coating began to exhibit extreme water repellency with WCA=about 170° and CAH<1°. FIG. 17C shows formation of a monolayer of L-CNPs after 30 min deposition, at which points the coating coverage reached saturation and extreme water repellency was observed. Such behavior was found to be attributed to the large nanostructure asperities formed from highly wiggly morphology of L-CNPs.

Example 11: Surface Morphology Comparison

This example was performed to illustrate that surfaces formed using the CNPs described herein result in a rougher surface than surfaces formed using SPs. These two surfaces correspond to the coatings of SPs and L-CNPs respectively described in Example 9. Specifically, FIGS. 7A/C are images and corresponding line profiles of the surface topography of the coatings formed from chain-like particles (FIG. 7A) and spherical particles (FIG. 7C). The dashed lines indicate the height equal to the diameters of the string-like particles (45 nm) and spherical particles (40 nm).

When SPs are coated on a substrate, due to charge induced adsorption, the height of the nanoparticle coating is rather small—no more than their diameter as confirmed by AFM scan and illustrated by schematics (FIG. 7C), therefore, water can easily impregnate into the air pockets between nanoparticles. For CNPs, they are flexible and wiggly and do not lay flat on surface. As seen in FIG. 7A, the height of L-CNPs is spiked due to their wiggly morphology, much larger than the diameter of the nanoparticles, creating two-tiered roughness. This not only increases surface roughness to enhance water repellency but also makes it more difficult for water to impregnate the grooves between CNPs.

The line profile for the spherical particles shows that the surface is smooth as opposed to the line profile for the chain-like particles which show that the surface is rough and undulating with surfaces heights averaging less than about 100 nm, while on L-CNPs coating, the nano-asperities with a height of about 200 nm to about 300 nm are formed that is believed to further enhance the coating nonwettability and robustness against water. See, FIGS. 7B/D.

Example 12: Wetting of Chain-like Particles at Different Ethanol/Water Concentrations While superhydrophobic surfaces can repel small droplet size water, they may not repel liquids with lower surface tensions, which can then impregnate the grooves between nanotextures. To demonstrate the two-tiered nanoroughness of the coatings, low surface tension liquid from ethanol/water mixture were prepared with different mixing ratios (up to 25 wt % ethanol) and the surface tension was reduced from 72.8 (pure water) to 36.0 mN/m at room temperature. Specifically, the L-CNPs coating was prepared following the same procedure as described in Example 3. In summary, the substrates were wetted with a water drop formed by ethanol/water mixture (0 to 25 wt % ethanol concentration), where the $CA_{adv}$, $CA_{rec}$, and CAH of the liquids on coating was plotted against the weight fraction of ethanol in the mixture.

Figure 13:
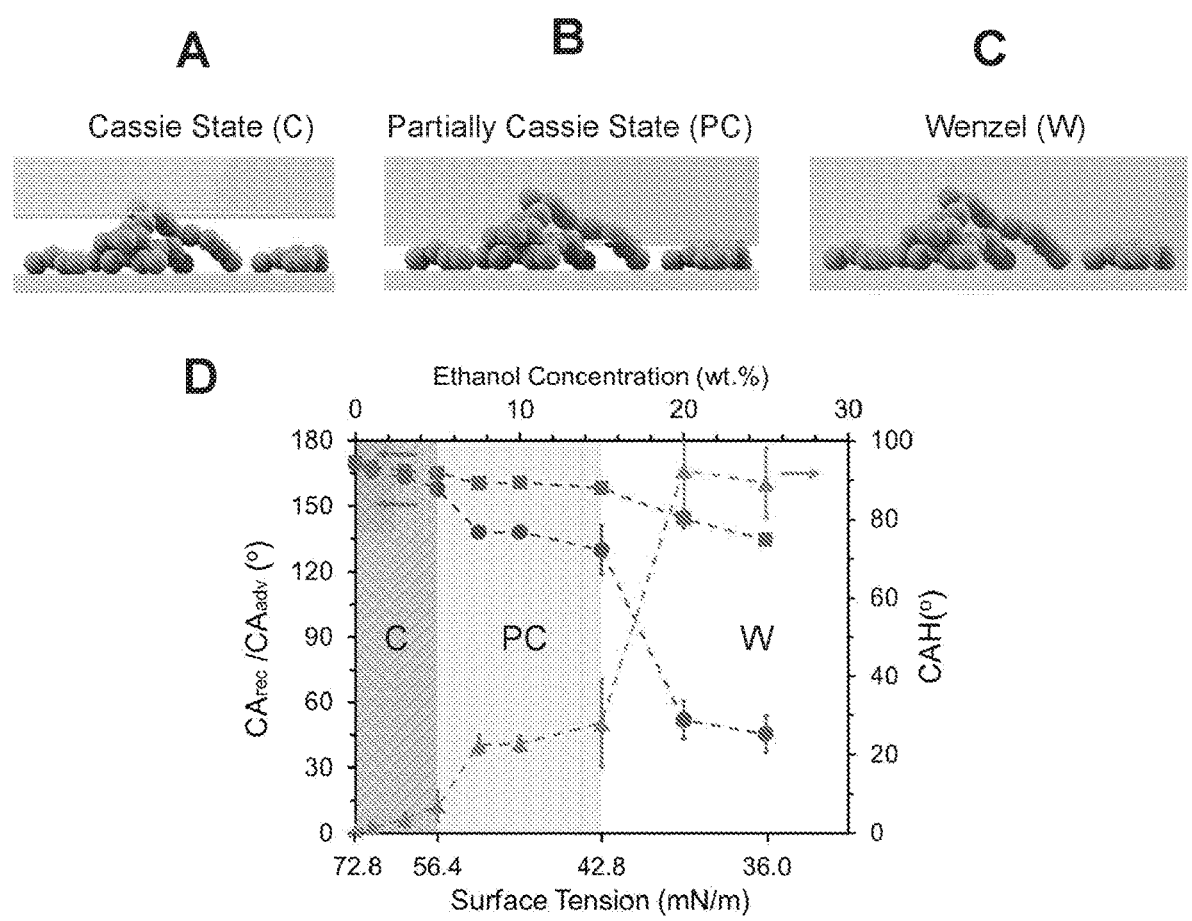
FIGS. 13A-C are images of the states assumed by, i.e., cassie state (FIG. 13A), partial cassie state (FIG. 13B), and wenzel state (FIG. 13C).
FIG. 13D is a plot of $CA_{adv}$ (■), $CA_{rec}$ (▲), and contact angle hysteresis (CAH, ●) as a function of surface tension upon wetting the chain-like particle coating surface with an ethanol/water mixture (0 to 25 wt % ethanol concentration).
Figure 14:
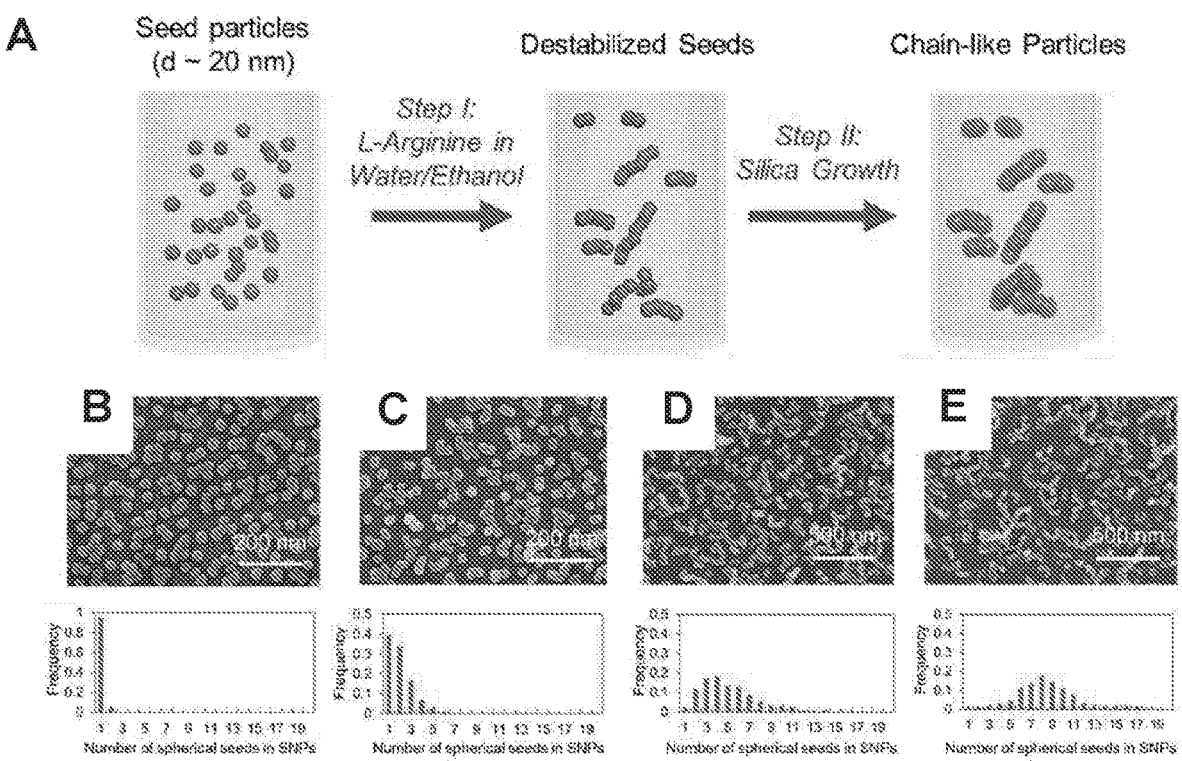
FIG. 14A are schematics showing CNP synthesis.
FIGS. 14B-E are SEM images of the synthesized CNPs and SPs used in the coatings. Histograms below each SEM image show the distribution of the number of silica seed particles that constitute each set of SPs (FIG. 14B), S-CNPs (FIG. 14C), I-CNPs (FIG. 14D), and L-CNPs (FIG. 14E).

FIG. 13D shows the $CA_{adv}$, $CA_{rec}$, and CAH for wetting of ethanol/water mixtures on both SPs and L-CNP coatings. The coating assembled from L-CNPs is resistant to low surface tension liquids. It was hypothesized that WCA underwent a two-step transition as a result of the variation of nano-asperities created by the wiggly chains (FIGS. 13A-C). When ethanol concentration was less than 5 wt %, $CA_{adv}$ was greater than 160°, indicating a full Cassie-Baxter state, where liquid remained in contact with locally protruded asperities. Drops in this region experienced only a very weak decrease in apparent WCA and slightly increase of CAH. As the ethanol concentration increased, the CAH increased sharply at two distinct critical concentrations, each indicating a wetting transition. After passing the first critical ethanol concentration, 5 wt %, the CAH increased from <7° to 22° as the ethanol concentration increased to 7.5 wt %. From 7.5 to 15 wt % ethanol concentration, the liquid remained un-pinned across the sample despite of increased CAH, suggesting that some regions remained dry. After passing the second critical concentration of 15 wt %, it became extremely difficult to recede the liquid droplets as they were pinned to the coating surface, suggesting a fully wetted surface. In this case, a full transition from Cassie-Baxter to Wenzel state occurred at surface tension of about 40 mN/m for L-CNPs, and about 55 mN/m for SPs coating, which indicates improvement of the Cassie-Baxter state stability on L-CNP coated surface.

Figure 12:
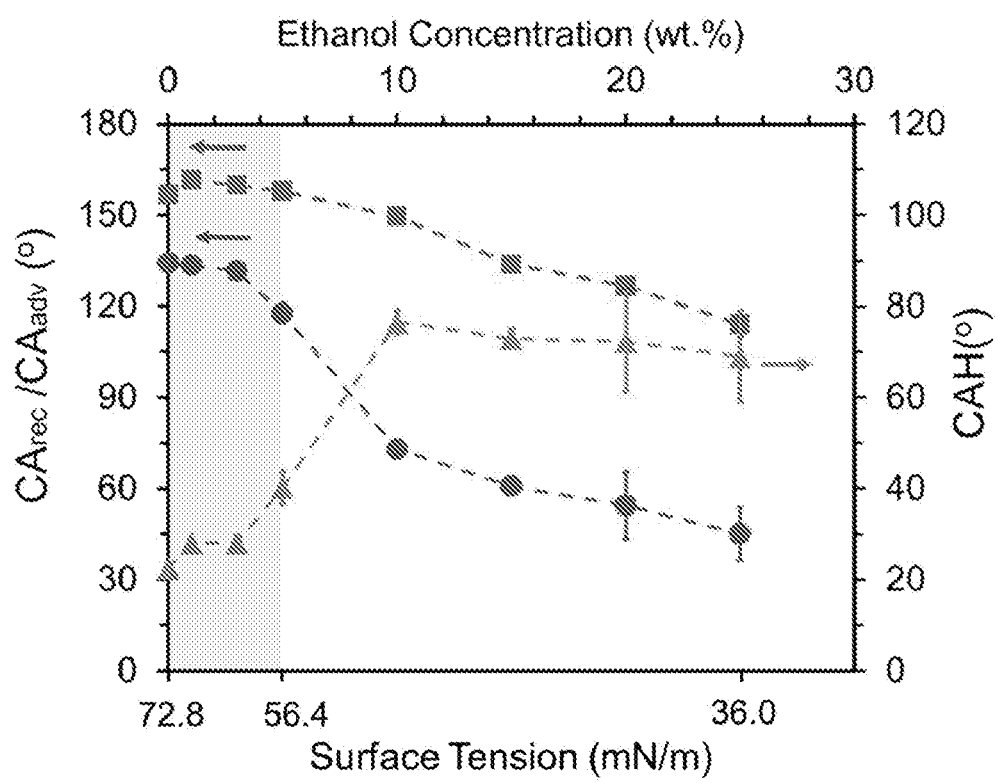
FIG. 12 is a plot of $CA_{adv}$ (■), $CA_{rec}$ (▲), and CAH (●) as a function of surface tension upon wetting the spherical particle coating surface with an ethanol/water mixture (0 to 25 wt % ethanol concentration).

FIGS. 12 and 13D are plots of $CA_{adv}$, $CA_{rec}$, and CAH as a function of surface tension for the spherical and nanoparticle coated substrates, respectively. These results show that the wiggly morphology of the L-CNPs improves the resistance of wetting by liquid with lower surface tension. The CAH increases in two steps, possibly attributed to the nano-asperities of different heights. When ethanol composition is low or the surface energy of the mixture remains high, the NP coated surface is in a Cassie-Baxter state, i.e., non-wettability state. When the ethanol concentration is increased from 15 to 20 wt % (as surface tension of liquid becomes lower than 42.8 mN/m), Wenzel state of wetting occurs.

Example 13: Effect of Coatings on Air Bubbles

In this example, the effect of different coatings in attaching air bubbles to coated surfaces pre-wetted with ethanol and the immersed in water was investigated. The CNP coatings were prepared using the same procedure as seen in Example 3. The Neverwet® coated surface was prepared according to the procedure given from the product instruction. See. Table 4.

TABLE 4

| Substrate | Result |
| --- | --- |
| thin CNP coating of Example 3 | air bubble adsorbed, underneath region recovered to the Cassie state |
| flat fluorinated glass | air bubble attached to flat fluorinated glass |
| NeverWet ® coated surface | air bubble not adsorbed, underneath region not recovered to Cassie state |
| Hydrophilic glass surface | air bubble not adsorbed |

In summary, when the air bubble contacted the Neverwet® coating, the air-bubble repelled completely due to the water trapped inside the surface roughness. On contrary, when the air bubble is contact to the ultra-thin nanoparticle coating described herein, the trapped water instantly evaporated into the air phase, and the air bubble adhered to the coating. In this case, the thin CNP coating behaves much like the flat fluorinated glass, indicating that it maintained hydrophobicity. In contrast, the ethanol pre-wetted Never-Wet® surface becomes hydrophilic due to trapped water in the roughness.

Example 14: Quickly Dried, Pre-Wetted Films

When superhydrophobic (SH) surfaces are contacted with water containing soluble contaminants that typically have lower surface tension, e.g. alcohol and surfactants, the soluble contaminants will wet the coating through the barrier of the surface roughness. This thereby replaces the air pockets trapped between the nanoroughness. If this happens, the coated surface loses superhydrophobic properties irreversibility since water or contaminants is trapped within the rough surface.

Accordingly, the effect of various contaminants in a fluorinated glass substrate, substrate coated with Neverwet®, and a substrate coated with the NP coating described herein was studied. In summary, these 3 surfaces were wetted by ethanol, and repetitively washed with pure water. A 20 µL water droplet was then placed on each substrate after being taken out from the rinsing water bath. FIG. 11 shows that entrapped contaminants are extremely difficult to remove from the fluorinated and Neverwet® substrates. This is due to the pinning effects from the surface roughness. For example, on Neverwet®, if the coating is first wetted by ethanol, upon following rinsing with pure water, the entrapped ethanol cannot be removed and the surface was found to become hydrophilic or areophobic.

However, entrapped ethanol is effectively removed from the substrate coated with the nanoparticle coating described herein.

Example 15: Enclosed Chamber Condensation

Condensation experiments on L-CNP coated surfaces described herein were performed an enclosed chamber to investigate its water repellency under condensation conditions. The temperature and humidity of the chamber, measured by a thermo-hygrometer mounted inside the chamber, was maintained at about 22° C.±1 and about 70±1%, respectively. The temperature of the substrates was kept at about 7±1° C., as measured by a thermocouple attached to the cooling module. The critical drop size before the water drop roll-off from the surface was used to evaluate the water repellency during condensation.

Figure 18:
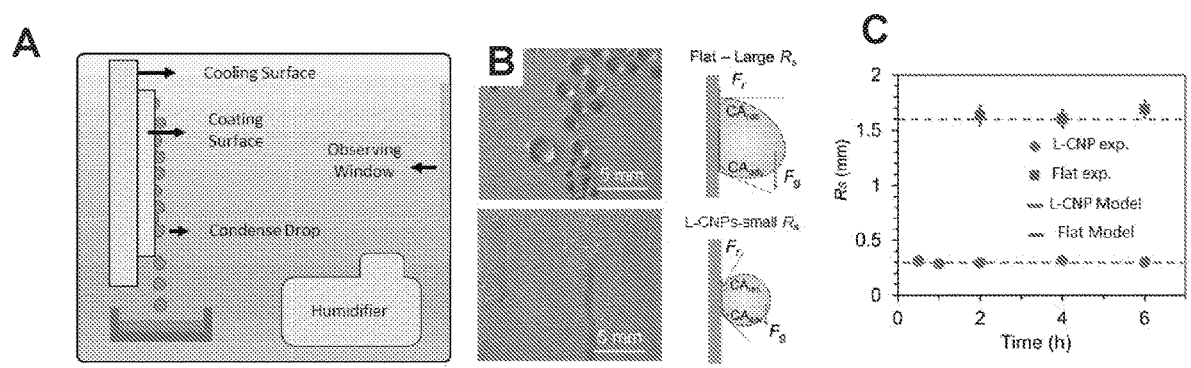
FIG. 18A is the schematic of the water condensation testing chamber.
FIG. 18B are optical images for water condensed on the L-CNP coating surface (bottom) and flat perfluorosilane coated substrate (top) at different time, maintaining significantly smaller drop size on the L-CNP coating surface.
FIG. 18C is a plot showing the experimentally measured critical radius of water drop removed by gravity ($R_s$) rolling-off from the surface vs. the value $R_s$ through balancing the $F_r$ and $F_g$, using $CA_{adv}=113\pm1°$, and $CA_{rec}=98\pm2°$ on a flat perfluorosilane treated surface and L-CNP coating, $CA_{adv}=165°$, $CA_{adv}=160°$.

Compared to a flat substrate treated with perfluorosilane ($CA_{adv}=113\pm1°$, and $CA_{rec}=98\pm2°$), the condensed water drops on L-CNP coated surface were easily swept away by the gravitational force during the entire condensation process up to 6 hours (FIG. 18B). On L-CNP coated surface, the water drops were removed at an average radius, $R_s=0.3\pm0.05$ mm, compared to that on the flat surface of $R_s=1.6\pm0.1$ mm. The mobility of water droplets is determined by the competition between the retention force ($F_r$) due to the wetting hysteresis on the coating surface and the gravitational force, $F_g$, of the water drop.

The gravitational force for a water droplet on a vertical surface is given by $F_g=\rho g V$, where V is the drop volume, $\rho$ is the density of water, g is the gravitational acceleration. The smaller size of the water drop departing from the coating surface indicates a smaller $F_g$ is required to overcome the $F_r$ from the L-CNP coating surface. Thus, the L-CNP surface is much more mobile compared to a flat hydrophobic surface. Quantitatively, the retention force due to CAH that resists mobility of water is given by equation 7:

$$F_r = 2r_c\gamma(\cos\theta_{rec} - \cos\theta_{adv}) \quad (7)$$

where $\gamma$ is the surface tension of water, $r_c$ is the radius of the contact line (considered as circular), $\theta_{adv}$ and $\theta_{rec}$ are the $CA_{adv}$ and $CA_{rec}$ respectively on the surface. Then, assuming the water drop has an approximate shape of spherical cap with a contact angle equal to $$\theta = \frac{\theta_{adv} + \theta_{rec}}{2},$$

the gravitational force on the drop can be expressed by equation 8:

$$F_g = \frac{\pi}{3}R_s^3(2+\cos\theta)(1-\cos\theta)^2 \quad (8)$$

Thus, $R_s$, which is the critical radius of water drop removed by gravity, can be estimated based on the measured $\theta_{adv}$ and $\theta_{rec}$ by balancing the $F_r$ and $F_g$ as in equation 9:

$$R_s = \left(\frac{6\gamma\sin\theta(\cos\theta_{rec}-\cos\theta_{adv})}{\pi\rho g(2+\cos\theta)(1-\cos\theta)^2}\right)^{\frac{1}{2}} \quad (9)$$

$R_s$ from experimental measurements were compared to the predicted values using equation 8. As seen FIG. 18C, the experimental $R_s$ was in good agreement with the predicted critical size range on a flat hydrophobic surface. For L-CNP coatings, the observed $R_s$ was reached when the superhydrophobic surface had a high CA and low CAH, e.g., at $\theta_{adv}=165°$, $\theta_{rec}=160°$, which have a predicted $R_s$ of 0.3 mm. Therefore, the coating surface maintained very high water repellency/mobility even with respect to vapor phase condensation. The observed $R_s$, however, was bigger than the values predicted by using the $\theta_{adv}$ and $\theta_{rec}$ measured from sessile drop method (i.e. $\theta_{adv}=170°$, $\theta_{rec}=169°$, and $R_s=0.05$ mm) suggesting the mobility of water droplets decreased. The small $R_s$ was maintained after up to 6 hours of continuous condensation, and thus the coating was highly robust against long-term exposure to saturated humidity environments. See, FIG. 18C.

During the condensation, other mechanisms of liquid departure from the coating surface were observed, e.g., jumping water drops due to coalesce from condensed microdrops, which also was an indication of maintained high water repellency upon water condensation. To investigate the detailed mechanism of how L-CNP coating repelled condensing liquids, nucleation and condensation phenomena were observed under environmental SEM (ESEM). On a L-CNP coated surface, the water drops initially nucleated within the surface roughness had a relatively low CA. However, the surface roughness confined propagation of the contact line during the growth of the micro-droplets. FIG. 10A. Thus, these micro-drops can reach CA>165° when the radius was greater than 3 µm. As the condensation proceeded, the coalesced micro-drops released themselves from the initially pinned areas by formation of a new larger drop (FIG. 10B) which explains the maintained high mobility of these water drops on the L-CNP coated surface.

It is to be understood that while the invention has been described in conjunction with the preferred specific embodiments thereof, that the foregoing description and the examples that follow are intended to illustrate and not limit the scope of the invention. It will be understood by those skilled in the art that various changes may be made and equivalents may be substituted without departing from the scope of the invention, and further that other aspects, advantages and modifications will be apparent to those skilled in the art to which the invention pertains. In addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article, and such combinations are considered within the scope of this invention.

The disclosures of each patent, patent application, and publication cited or described in this document are hereby incorporated herein by reference, each in its entirety, for all purposes.

What is claimed:

1. A coating adhered to a substrate surface, the coating comprising a layer of anisotropic chain-like three-dimensionally aggregated silica nanoparticles, wherein:
   said anisotropic chain-like three-dimensionally aggregated silica nanoparticles comprise linked arrays of silica net-negatively charged nanoparticles, each linked array having at least one linear dimension of about 100 nm to about 1200 nm and said anisotropic chain-like three-dimensionally aggregated silica nanoparticles each have a diameter of about 20 nm to about 80 nm;
   the substrate surface comprises surface active moieties carrying a net positive charge;
   said anisotropic chain-like three-dimensionally aggregated silica nanoparticles are held to said surface by electrostatic charge;
   said coating defines a surface topography defined by the anisotropic chain-like silica on the substrate, said coating defining a coverage of less than about 45% of the substrate surface, and said layered coating being hydrophobic and said layered coating transmitting greater than about 90% of incident light having a wavelength in a range of about 400 nm to about 800 nm.

2. The coating of claim 1 which transmits greater than about 90% of incident light at variable incidence angles ranging from 0 to 50° at a wavelength of 500 nm.

3. The coating of claim 1, wherein said substrate is glass, silicon, poly(dimethylsiloxane), polyester, polystyrene, poly (methyl methacrylate), poly(carbonate), plastic, fabric, or any combination thereof.

4. The coating of claim 1, wherein said surface active moieties carrying a net positive charge are amino groups.

5. The coating of claim 1, wherein said silica net-negatively charged nanoparticles comprise acid moieties.

6. The coating of claim 1, wherein the average cross sectional dimension of at least one of the nanoparticles is from about 20 to about 40 nm.

7. The coating of claim 1, which substantially resists condensation, fogging, or a combination thereof.

8. The coating of claim 1, wherein said topography is a roughness of from about 20 to about 200 nm.

9. The coating of claim 1, which has a thickness of about 100 nm or less.

10. The coating of claim 1, wherein said surface active moieties are present in a layer on said substrate.

11. The coating of claim 10, wherein said layer comprising said surface active moieties is about 0.1 to about 3 nm in thickness.

12. The coating of claim 1, wherein the layered coating is present as a monolayer on the substrate.

13. The coating of claim 1, further comprising a perfluorosilane passivation on the anisotropic chain-like three-dimensionally aggregated silica nanoparticles.

* * * * *

UNITED STATES PATENT AND TRADEMARK OFFICE
CERTIFICATE OF CORRECTION

| | | |
|---|---|---|
| PATENT NO. | : 11,365,333 B2 | |
| APPLICATION NO. | : 16/099843 | |
| DATED | : June 21, 2022 | |
| INVENTOR(S) | : Shu Yang et al. | |

It is certified that error appears in the above-identified patent and that said Letters Patent is hereby corrected as shown below:

On the Title Page

Item (56) In Other Publications, Page 2, Under Column No. 2, Line no. 34, Replace, "of Meterology," With -- of Meteorology, --

In the Drawings

Sheet 6 of 20, Fig 5A, (Y-axis), Replace, "Transmitance" With -- Transmittance --

Sheet 6 of 20, Fig 5B, (Y-axis), Replace, "Transmitance" With -- Transmittance --

In the Specification

Under Column No. 3, Line no. 39, Replace, "angles)(° at" With -- angles (°) at --

Under Column No. 6, Line no. 38, Replace, "enrolling 10-4" With -- enrolling 10-µL --

Under Column No. 9, Line no. 33, Replace, "$Cr_2O_7^{2-}$, pyridinium" With -- $Cr_2O_7^{2-}$, $CrO_3$, pyridinium --

Under Column No. 9, Line no. 48, Replace, "triethoxylsilyl-propyl" With -- triethoxysilyl-propyl --

Under Column No. 10, Line no. 55, Replace, "triethoxylsilyl-propyl" With -- triethoxysilyl-propyl --

Under Column No. 18, Line no. 24, Replace, "(see FIG. 14D-E)." With -- (see FIGS. 14D-E). --

Under Column No. 20, Line no. 63, Replace, "of Meterology," With -- of Meteorology, --

Under Column No. 25, Line no. 36, Replace, "$(T+R)_{uncoated}$ $(T+R)_{coated}$" With -- $(T+R)_{uncoated}$ - $(T+R)_{coated}$ --

Signed and Sealed this
Fifteenth Day of November, 2022

Katherine Kelly Vidal
*Director of the United States Patent and Trademark Office*

CERTIFICATE OF CORRECTION (continued)
U.S. Pat. No. 11,365,333 B2

Under Column No. 29, Line no. 22, Replace, "by $F_9=\rho gV$," With -- by $F_g=\rho gV$, --

Under Column No. 29, Line no. 25, Replace, "smaller $F_9$ is" With -- smaller $F_g$ is --